United States Patent
Kumaki

(10) Patent No.: US 10,536,675 B2
(45) Date of Patent: Jan. 14, 2020

(54) IMAGE CAPTURING APPARATUS, DRIVING METHOD THEREFOR, AND IMAGE CAPTURING SYSTEM

(71) Applicant: CANON KABUSHIKI KAISHA, Tokyo (JP)

(72) Inventor: Satoshi Kumaki, Kawasaki (JP)

(73) Assignee: Canon Kabushiki Kaisha, Tokyo (JP)

(*) Notice: Subject to any disclaimer, the term of this patent is extended or adjusted under 35 U.S.C. 154(b) by 118 days.

(21) Appl. No.: 15/712,535

(22) Filed: Sep. 22, 2017

(65) Prior Publication Data

US 2018/0098037 A1 Apr. 5, 2018

(30) Foreign Application Priority Data

Oct. 4, 2016 (JP) .................................. 2016-196730
Jun. 27, 2017 (JP) .................................. 2017-125588

(51) Int. Cl.

| H04N 5/357 | (2011.01) |
|---|---|
| H04N 9/04 | (2006.01) |
| H04N 5/232 | (2006.01) |
| H04N 5/378 | (2011.01) |
| H03M 1/10 | (2006.01) |
| H03M 1/12 | (2006.01) |

(52) U.S. Cl.
CPC ............ *H04N 9/04* (2013.01); *H03M 1/1023* (2013.01); *H03M 1/12* (2013.01); *H04N 5/23245* (2013.01); *H04N 5/357* (2013.01); *H04N 5/378* (2013.01)

(58) Field of Classification Search
CPC .............................. H03M 1/825; H04N 5/357

USPC ......................................... 341/169; 348/241
See application file for complete search history.

(56) References Cited

U.S. PATENT DOCUMENTS

| 2008/0211951 A1* | 9/2008 | Wakabayashi ....... H04N 5/3655 348/308 |
|---|---|---|
| 2015/0156435 A1 | 6/2015 | Ota |
| 2015/0162929 A1* | 6/2015 | Shinozuka ............. H04N 5/378 348/294 |
| 2017/0195607 A1* | 7/2017 | Bulteel .................. H04N 5/378 |
| 2017/0276807 A1* | 9/2017 | Nishihara ............. G01T 1/2018 |
| 2019/0007637 A1* | 1/2019 | Nishikido ............. H04N 5/378 |

FOREIGN PATENT DOCUMENTS

JP 2015-106816 A 6/2015

\* cited by examiner

*Primary Examiner* — Anthony J Daniels
(74) *Attorney, Agent, or Firm* — Venable LLP

(57) ABSTRACT

An image capturing apparatus is provided. The apparatus comprises a pixel array, a signal generator that generates a comparison signal whose electric potential changes with time and a converter that converts a pixel signal into a digital signal. The comparison signal starts to change from a first electric potential in accordance with a start of the conversion of the pixel signal by the converter, and changes again, in accordance with inversion of a magnitude relationship between the pixel signal and the comparison signal, from a third electric potential between the first electric potential and a second electric potential at which the magnitude relationship is inverted. The converter includes a counter that holds, as a signal value, a count value obtained by counting from the start of the conversion of the pixel signal until the inversion of the magnitude relationship.

22 Claims, 29 Drawing Sheets

| DETERMINATION COUNT | COMPARISON SIGNAL |
|---|---|
| 0 | Ramp1 |
| 1 | Ramp1 |
| 2 | Ramp2 |
| 3 | Ramp3 |
| 4 | Ramp3 |

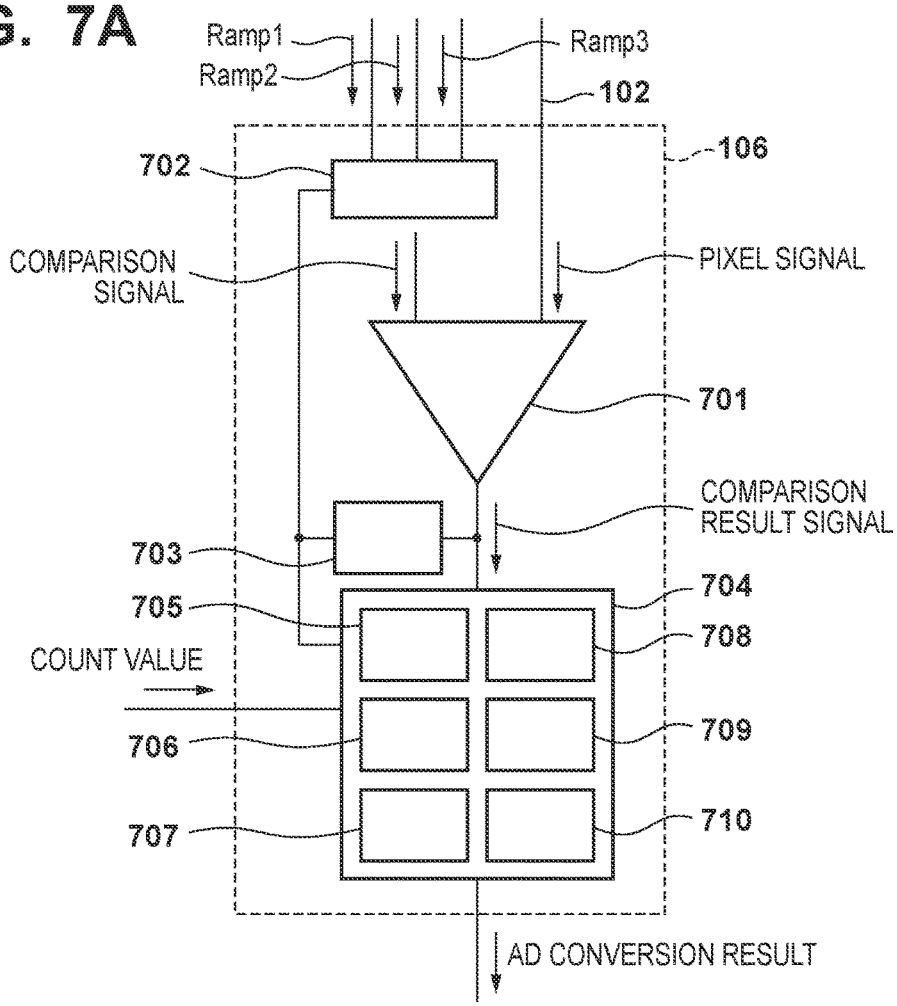

FIG. 13A

| | | CHANGE RATE OF REFERENCE SIGNAL: HIGH | | |
|---|---|---|---|---|
| | | TEMPERATURE OF IMAGE CAPTURING APPARATUS | | |
| | | TEMPERATURE < 10°C | 10°C ≤ TEMPERATURE < 40°C | TEMPERATURE ≥ 40°C |
| AMPLIFICATION FACTOR OF COLUMN AMPLIFIER | x1 | DELAY TIME: SHORT | DELAY TIME: SHORT | DELAY TIME: SHORT |
| | x2 | DELAY TIME: SHORT | DELAY TIME: SHORT | DELAY TIME: SHORT |
| | x4 | DELAY TIME: SHORT | DELAY TIME: SHORT | DELAY TIME: MEDIUM |
| | x8 | DELAY TIME: SHORT | DELAY TIME: MEDIUM | DELAY TIME: LONG |

FIG. 13B

| | | CHANGE RATE OF REFERENCE SIGNAL: LOW | | |
|---|---|---|---|---|
| | | TEMPERATURE OF IMAGE CAPTURING APPARATUS | | |
| | | TEMPERATURE < 10°C | 10°C ≤ TEMPERATURE < 40°C | TEMPERATURE ≥ 40°C |
| AMPLIFICATION FACTOR OF COLUMN AMPLIFIER | x1 | DELAY TIME: SHORT | DELAY TIME: MEDIUM | DELAY TIME: MEDIUM |
| | x2 | DELAY TIME: MEDIUM | DELAY TIME: MEDIUM | DELAY TIME: LONG |
| | x4 | DELAY TIME: MEDIUM | DELAY TIME: LONG | DELAY TIME: LONG |
| | x8 | DELAY TIME: LONG | DELAY TIME: LONG | DELAY TIME: LONG |

TEMPERATURE INFORMATION

FIG. 17

| | | TEMPERATURE OF IMAGE CAPTURING APPARATUS | | |
|---|---|---|---|---|
| | | TEMPERATURE < 10°C | 10°C ≤ TEMPERATURE < 40°C | TEMPERATURE ≥ 40°C |
| AMPLIFICATION FACTOR OF COLUMN AMPLIFIER | x1 | MODE 1 | MODE 1 | MODE 1 |
| | x2 | MODE 1 | MODE 1 | MODE 1 |
| | x4 | MODE 1 | MODE 1 | MODE 2 |
| | x8 | MODE 1 | MODE 2 | MODE 3 |

F I G. 18B

| DETERMINATION COUNT | SIGNAL LEVEL < FIRST THRESHOLD | FIRST THRESHOLD ≤ SIGNAL LEVEL < SECOND THRESHOLD | SIGNAL LEVEL ≥ SECOND THRESHOLD |
|---|---|---|---|
| 0 | Ramp1 | Ramp1 | Ramp1 |
| 1 | Ramp1 | Ramp1 | Ramp1 |
| 2 | Ramp2 | Ramp3 | Ramp4 |
| 3 | Ramp3 | Ramp5 | Ramp7 |
| 4 | Ramp4 | Ramp7 | Ramp7 |
| 5 | Ramp5 | Ramp7 | |
| 6 | Ramp6 | | |
| 7 | Ramp7 | | |
| 8 | Ramp7 | | |

IMAGE CAPTURING APPARATUS, DRIVING METHOD THEREFOR, AND IMAGE CAPTURING SYSTEM

BACKGROUND OF THE INVENTION

Field of the Invention

The present invention relates to an image capturing apparatus, a driving method therefor, and an image capturing system.

Description of the Related Art

As an image capturing apparatus used for an image capturing system such as a digital camera, there is known a CMOS image sensor that simultaneously performs analog-to-digital conversion (to be referred to as AD conversion hereinafter) for each column on a chip to reduce circuit noise and increase the readout rate. Japanese Patent Laid-Open No. 2015-106816 describes an image capturing apparatus that performs AD conversion a plurality of times for a low luminance signal of a low signal level while performing AD conversion once for a high luminance signal of a high signal level with respect to signals output from a plurality of pixels. By performing AD conversion a plurality of times for a low luminance signal in which circuit noise is easy to observe and averaging conversion results, it is possible to reduce circuit noise without changing a period during which AD conversion is performed.

SUMMARY OF THE INVENTION

It is considered to reduce circuit noise by performing AD conversion a plurality of times for a signal of a higher signal level in addition to a low luminance signal, as described in Japanese Patent Laid-Open No. 2015-106816. In this case, although circuit noise is reduced, the problem that an AD conversion period largely extends arises.

Some embodiments of the present invention provide a technique advantageous in suppressing circuit noise without largely extending an AD conversion period.

According to some embodiments, an image capturing apparatus comprising a pixel array in which a plurality of pixels are arranged, a signal generator that generates a comparison signal whose electric potential changes with time, and a converter that converts a pixel signal output from the pixel array into a digital signal for each column, wherein the comparison signal starts to change from a first electric potential in accordance with a start of the conversion of the pixel signal by the converter, and changes again, in accordance with inversion of a magnitude relationship between the pixel signal and the comparison signal, from a third electric potential between the first electric potential and a second electric potential at which the magnitude relationship is inverted, and the converter includes a counter that holds, as a signal value, a count value obtained by counting, every time the magnitude relationship is inverted, from the start of the conversion of the pixel signal until the inversion of the magnitude relationship, is provided.

According to some other embodiments, an image capturing system comprising: an image capturing apparatus; and a signal processor that generates an image by processing a signal output from the image capturing apparatus, wherein the image capturing apparatus comprises a pixel array in which a plurality of pixels are arranged, a signal generator that generates a comparison signal whose electric potential changes with time, and a converter that converts a pixel signal output from the pixel array into a digital signal for each column, wherein the comparison signal starts to change from a first electric potential in accordance with a start of the conversion of the pixel signal by the converter, and changes again, in accordance with inversion of a magnitude relationship between the pixel signal and the comparison signal, from a third electric potential between the first electric potential and a second electric potential at which the magnitude relationship is inverted, and the converter includes a counter that holds, as a signal value, a count value obtained by counting, every time the magnitude relationship is inverted, from the start of the conversion of the pixel signal until the inversion of the magnitude relationship, is provided.

According to some other embodiments, a driving method for an image capturing apparatus including a pixel array in which a plurality of pixels are arranged and a signal generator that generates a comparison signal whose electric potential changes with time, the method comprising: converting a pixel signal output from the pixel array into a digital signal for each column, wherein the comparison signal starts to change from a first electric potential in accordance with a start of the conversion of the pixel signal, and changes again, in accordance with inversion of a magnitude relationship between the pixel signal and the comparison signal, from a third electric potential between the first electric potential and a second electric potential at which the magnitude relationship is inverted, and the converting includes holding, as a signal value, a count value obtained by counting, every time the magnitude relationship is inverted, from the start of the conversion of the pixel signal until the inversion of the magnitude relationship, is provided.

Further features of the present invention will become apparent from the following description of exemplary embodiments (with reference to the attached drawings).

BRIEF DESCRIPTION OF THE DRAWINGS

FIGS. 7A and 7B are a circuit diagram and a table, respectively, showing an example of the circuit arrangement of a converter of an image capturing apparatus shown in FIG. 1 and the relationship between a determination count and a comparison signal;

FIGS. 13A and 13B are tables each showing the relationship between a driving signal and the image acquisition conditions of the image capturing apparatus shown in FIG. 11;

FIG. 17 is a table showing the relationship between a mode signal and the image acquisition conditions of the image capturing apparatus shown in FIG. 14;

FIGS. 18A and 18B are a circuit diagram and a table, respectively, showing an example of the circuit arrangement of a converter of an image capturing apparatus shown in FIG. 14 and the relationship between a determination count and a comparison signal.

DESCRIPTION OF THE EMBODIMENTS

Figure 1:
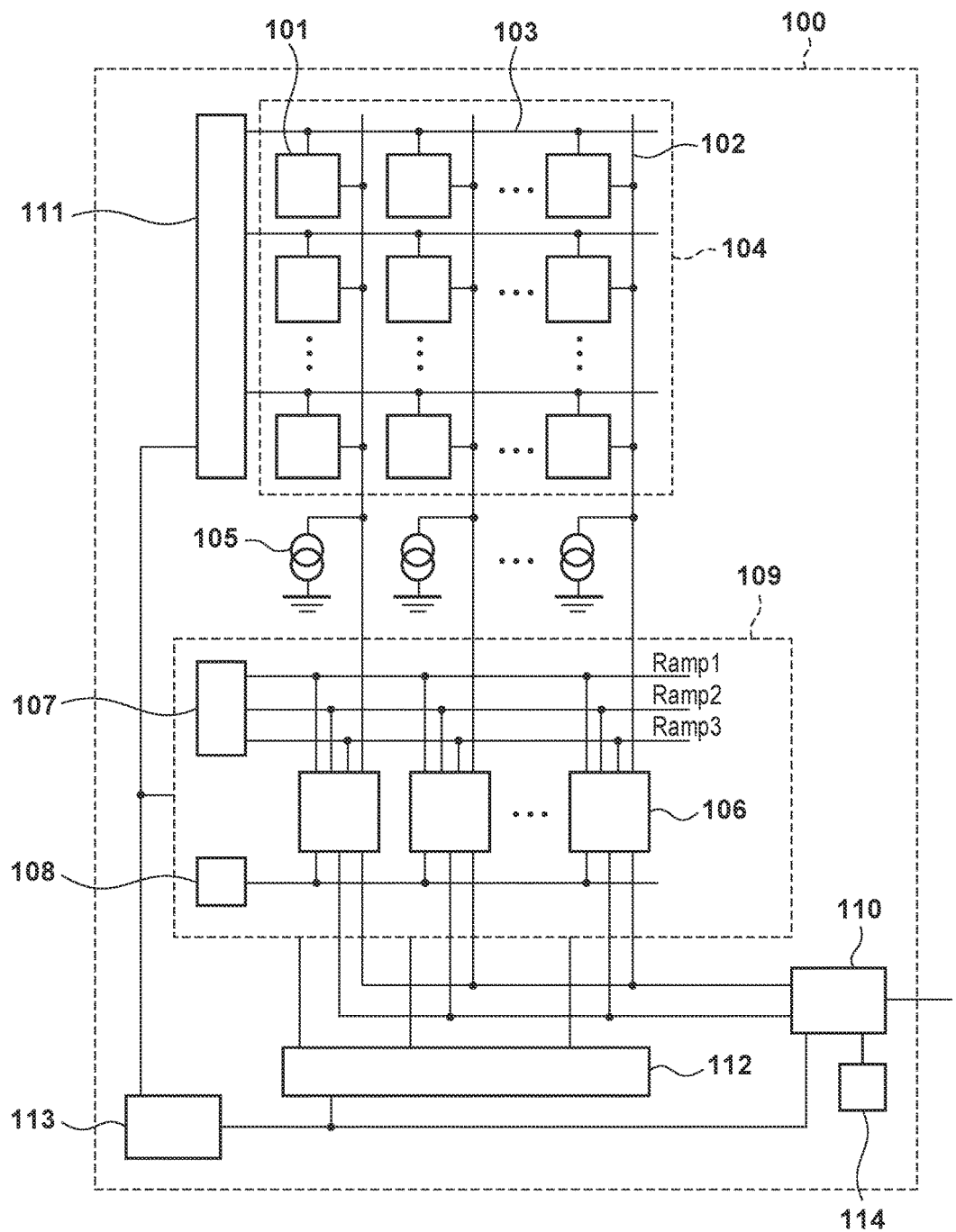
FIG. 1 is a circuit diagram showing an example of the circuit arrangement of an image capturing apparatus according to an embodiment of the present invention.

Detailed embodiments and examples of an image capturing apparatus according to the present invention will be described below with reference to the accompanying drawings. Note that in the following description and drawings, common reference numerals denote common components throughout a plurality of drawings. Hence, the common components will be described by cross-referring to the plurality of drawings, and a description of components denoted by common reference numerals will appropriately be omitted.

The arrangement of a CMOS image sensor serving as an image capturing apparatus according to an embodiment of the present invention and a driving method therefor will be described with reference to FIGS. 1 to 6. FIG. 1 shows an example of the circuit arrangement of an image capturing apparatus 100 according to a first embodiment of the present invention. In this embodiment, the image capturing apparatus 100 includes a pixel array 104, current sources 105, an analog-to-digital (AD) converter 109, an output circuit 110, a vertical scanning circuit 111, a horizontal scanning circuit 112, and a controller 113. The pixel array 104 includes a plurality of pixels 101, a plurality of vertical output lines 102, and a plurality of driving signal lines 103. The AD converter 109 includes converters 106, a signal generator 107, and a counter 108.

The pixels 101 are arranged in a two-dimensional array in the pixel array 104, and each convert incident light into an electrical signal. Each pixel 101 accumulates photoelectrically converted charges. Each vertical output line 102 is connected to the pixels 101 arranged in the vertical direction (column direction), and a signal is output from each of the pixels 101. Each driving signal line 103 is connected to the pixels 101 arranged in the horizontal direction (row direction), and a control pulse for controlling the pixels 101 is output from the vertical scanning circuit 111. In this arrangement, the pixels 101 arranged on the same row simultaneously output signals to the AD converter 109 via the corresponding vertical output lines 102.

The converters 106 simultaneously perform AD conversion for the respective columns of the pixel array 104 by comparing the signals output from the pixels 101 of the pixel array 104 with a reference signal used as a comparison signal among a plurality of reference signals output from the signal generator 107. AD conversion is performed for the reference signal (N signal) based on a reset level at the time of reset cancellation in the pixel 101 and a pixel signal (S signal) based on charges obtained by photoelectrically converting light incident on the pixel 101. The N signal can be, for example, a signal when the pixel array 104 is not irradiated with light. AD conversion is performed once for the N signal and performed for the S signal once to three times in this embodiment, although details will be described later. Each converter 106 outputs, to the output circuit 110, a determination count indicating the number of times AD conversion is performed for the S signal in addition to AD conversion results as digital signals obtained by converting the N signal and S signal.

The signal generator 107 generates a plurality of reference signals. The reference signals include ramp signals Ramp1, Ramp2, and Ramp3 whose electric potentials change with time. The electric potentials of Ramp1, Ramp2, and Ramp3 may change from the same electric potential. The electric potential of Ramp2 starts to change with a delay of a preset time after the start of a change of the electric potential of Ramp1, and changes to follow Ramp1. Similarly, the electric potential of Ramp3 starts to change with a delay of a preset time after the start of the change of the electric potential of Ramp2, and changes to follow Ramp2. In other words, the electric potential of Ramp3 starts to change with a delay of a preset time after the start of the change of the electric potential of Ramp1, and changes to follow Ramp1. The signal generator 107 outputs Ramp1, Ramp2, and Ramp3 to different signal lines. The counter 108 supplies a count value to be used by each converter 106 to count. Each converter 106 compares the magnitude relationship between the reference signal selected as the comparison signal and the N signal or the S signal, and holds the count value when the magnitude relationship between the reference signal and the N signal or the S signal is inverted, thereby performing AD conversion.

The output circuit 110 performs reference level correction of subtracting a "reference value" as a digital signal obtained by AD-converting the N signal from a "signal value" as a digital signal obtained by AD-converting the S signal. The reference level correction calculates a signal based on the charges accumulated in the pixel 101. The output circuit 110 performs, for the signal calculated by the reference level correction, offset correction or gain correction according to the reference signal used as the comparison signal at the time of AD conversion in accordance with the determination count output from the converter 106. The corrected signal is output from the output circuit 110 to the outside of the image capturing apparatus 100.

The vertical scanning circuit 111 outputs a driving pulse to the driving signal line 103. By changing the driving signal line 103 to which the driving pulse is output, signals from the pixels 101 on each row are output to the AD converter 109. The horizontal scanning circuit 112 outputs a driving signal to the AD converter 109 to sequentially output, to the output circuit 110, the determination counts and the AD conversion results such as the signal values and reference values held in the converters 106 arranged for the respective columns. The controller 113 outputs a control signal to each of the AD converter 109, output circuit 110, vertical scanning circuit 111, and horizontal scanning circuit 112, thereby performing timing control of the overall image capturing apparatus 100. Each current source 105 is connected to the corresponding vertical output line 102, and functions as a load when outputting the signal from each pixel 101.

Figure 2:
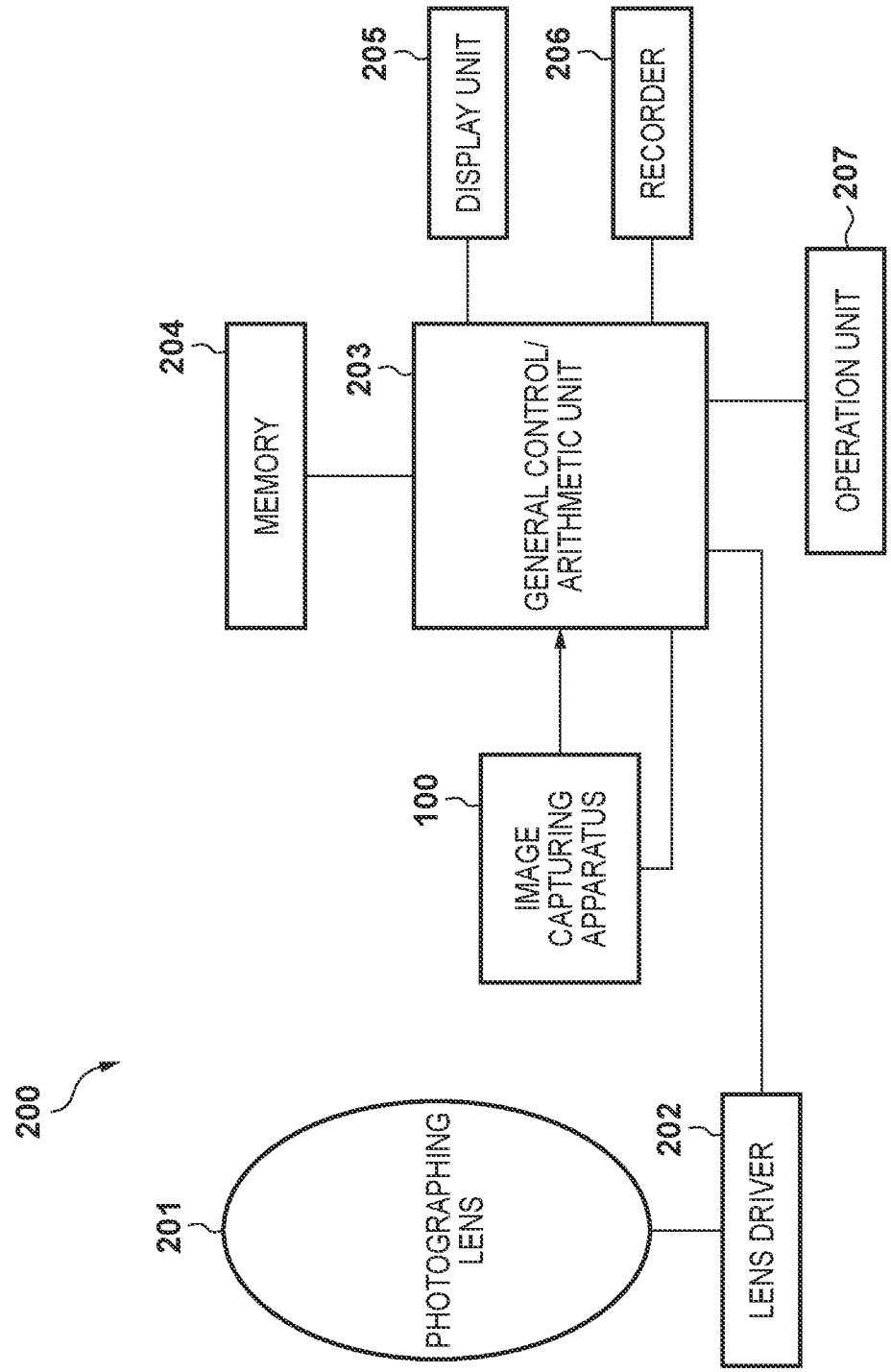
FIG. 2 is a block diagram showing an example of the arrangement of an image capturing system including the image capturing apparatus shown in FIG. 1.

FIG. 2 shows an example of the arrangement of an image capturing system 200 (for example, a digital camera) incorporating the image capturing apparatus 100 according to this embodiment. A photographing lens 201 forms an optical image of an object in the image capturing apparatus 100. A lens driver 202 drives the photographing lens 201 to perform zoom control, focus control, aperture control, and the like. A general control/arithmetic unit 203 functions as a signal processor that performs processing such as correction of a signal output from the image capturing apparatus 100 and generation of an image, and also controls the overall image capturing system 200. A memory 204 functions as a memory for temporarily storing image data. A display unit 205 is a device that displays various kinds of information and images. A recorder 206 is, for example, a detachable semiconductor memory for recording or reading out image data. An operation unit 207 serves as various interfaces of the image capturing system 200, and the general control/arithmetic unit 203 controls the respective components of the image capturing system 200 in accordance with an instruction input by the user via the operation unit 207.

Figure 3:
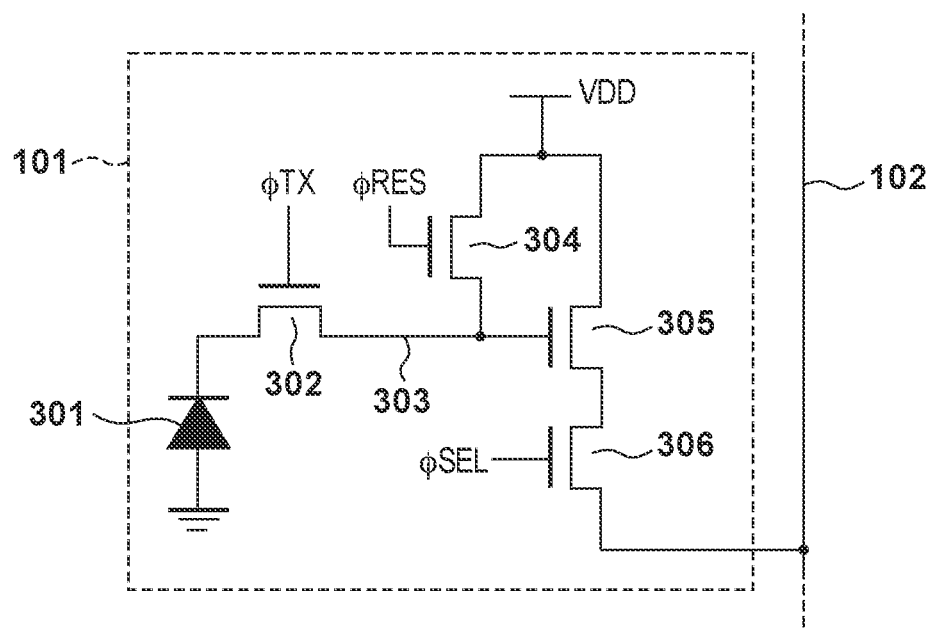
FIG. 3 is a circuit diagram showing an example of the circuit arrangement of a pixel of the image capturing apparatus shown in FIG. 1.

FIG. 3 shows an example of the circuit arrangement of each of the pixels 101 arranged in the pixel array 104 of the image capturing apparatus 100. The pixel 101 is provided with a photoelectric converter that performs photoelectric conversion, and a photodiode (PD) 301 is used in this embodiment. In addition, the pixel 101 includes a transfer transistor (TX) 302, a floating diffusion (FD) 303, a reset transistor (RES) 304, an amplification transistor (SF) 305, and a selection transistor (SEL) 306. Driving pulses φTX, φRES, and φSEL are respectively transferred from the vertical scanning circuit 111 to the TX 302, RES 304, and SEL 306 via the driving signal line 103.

The PD 301 functions as a charge accumulator and a photoelectric converter that converts light entering the pixel 101 into an electrical signal. The signal converted into the charges in the PD 301 is output to the FD 303 via the TX 302. The TX 302 performs the ON operation when the driving pulse φTX is set at high level, and transfers the charges accumulated in the PD 301 to the FD 303. The FD 303 performs charge-voltage conversion for the charges transferred from the PD 301 by a parasitic capacitance connected to the FD 303. The RES 304 performs the ON operation when the driving pulse φRES is set at high level, and causes the charges transferred to the FD 303 to flow into a power supply VDD to reset the electric potential of the FD 303. The SF 305 amplifies the current of the signal of the FD 303, and output the signal of the FD 303 to the converter 106.

The SEL 306 performs the ON operation when the driving pulse φSEL is set at high level, and outputs a signal corresponding to the electric potential of the FD 303 to the vertical output line 102. By controlling ON/OFF of the SEL 306, the signals of each pixel 101 on the selected row among the pixels 101 arranged in the array are output to the vertical output line 102. The signals output from each pixel 101 include an N signal that is output to the pixel array in a reset cancellation state in which the driving pulse φRES is at low level after reset of the FD 303, and an S signal for transferring a signal photoelectrically converted in the PD 301 after reset cancellation, as described above.

Figures 4A, 4B:
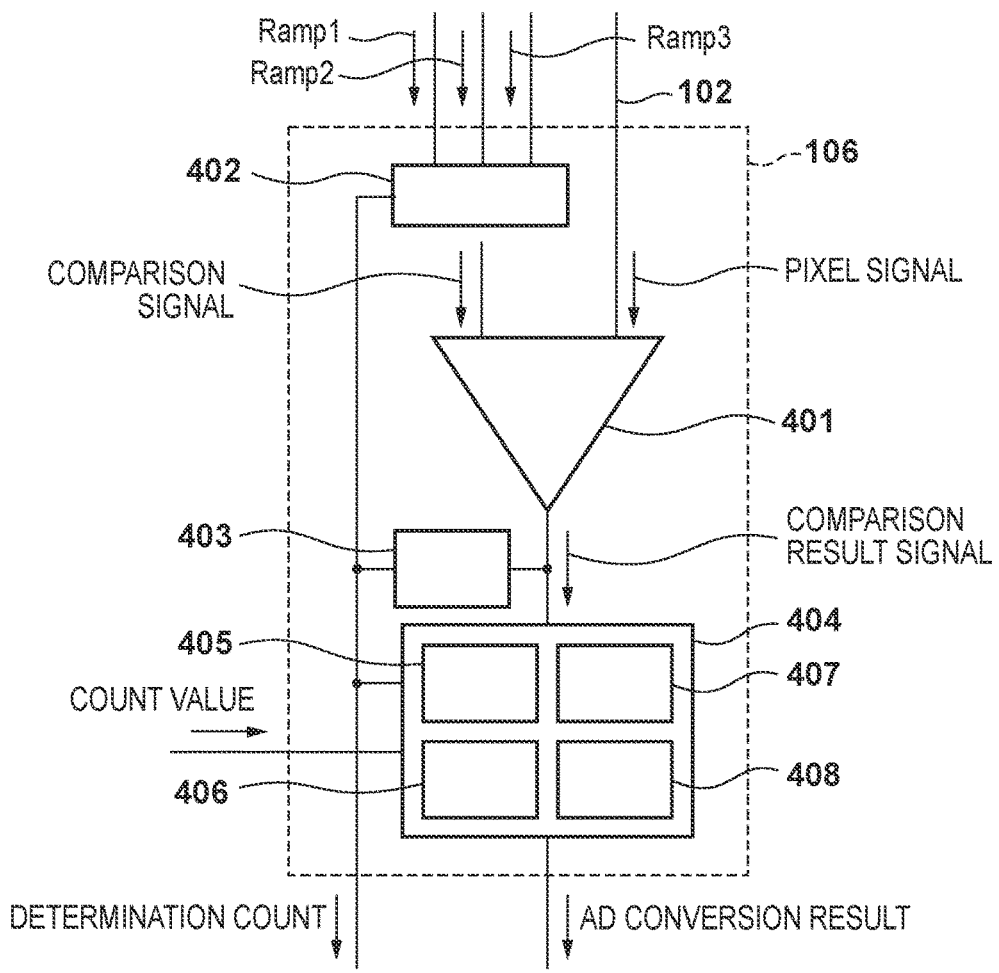
FIGS. 4A and 4B are a circuit diagram and a table, respectively, showing an example of the circuit arrangement of a converter of the image capturing apparatus shown in FIG. 1 and the relationship between a determination count and a comparison signal.

The converter 106 according to this embodiment will be described next with reference to FIGS. 4A and 4B. FIG. 4A shows an example of the circuit arrangement of the converter 106 of the image capturing apparatus 100. FIG. 4B shows the relationship between the determination count and the reference signal selected as the comparison signal.

The converter 106 includes a comparator 401, a switch 402, a determination count counter 403, and a counter 404. The counter 404 includes an N signal latch 405, an S signal latch A 406, an S signal latch B 407, and an S signal latch C 408.

The comparator 401 compares the N signal or S signal input via the vertical output line 102 with the comparison signal, and outputs high level or low level as a comparison result signal in accordance with the magnitude relationship. In this embodiment, if the electrical potential of the S signal is higher than that of the comparison signal, high level is output.

The switch 402 selects the reference signal to be used as the comparison signal from the reference signals Ramp1, Ramp2, and Ramp3 output from the signal generator 107. More specifically, the switch 402 switches the reference signal to be used as the comparison signal in accordance with a determination count output from the determination count counter 403 (to be described next). With respect to the relationship between the determination count and the comparison signal, as shown in FIG. 4B, the switch 402 switches the reference signal to Ramp1 if the determination count is 0 or 1, to Ramp2 if the determination count is 2, and to Ramp3 if the determination count is 3 or 4, thereby using the reference signal as the comparison signal.

The determination count counter 403 operates as a counter that increases the determination count every time the comparison result signal changes to high level, and outputs the count value as the determination count. The determination count is output to the switch 402, the counter 404, and the output circuit 110.

The counter 404 holds the count value counted by the counter 108 in a latch corresponding to the determination count at the timing when the output of the comparator 401 changes to high level, that is, the magnitude relationship between the comparison signal and the N signal or the S signal is inverted from that when AD conversion starts. If the determination count is 0, when the output of the comparator 401 changes to high level, the counter 404 holds, in the N signal latch 405, the count value as a reference value obtained by AD-converting the N signal. If the determination count is 1, that is, if the output of the comparator 401 changes to high level next, the counter 404 holds, in the S signal latch A 406, the count value as a signal value obtained by AD-converting the S signal. After that, the counter 404 holds the count value as a signal value in each of the S signal latch B 407 and the S signal latch C 408. If the determination count is 4, in this embodiment, the output of the comparator 401 never changes to high level, and the counter holds no count value in any latch. The signal values and reference value held in the latches are output as AD conversion results to the output circuit 110. For the following description, the signal value held in the S signal latch A 406, that held in the S signal latch B 407, and that held in the S signal latch C 408 will be referred to as S signal value A, S signal value B and S signal value C, respectively, hereinafter. Similarly, the reference value held in the N signal latch 405 will be referred to as an N signal value hereinafter.

Figure 5A:
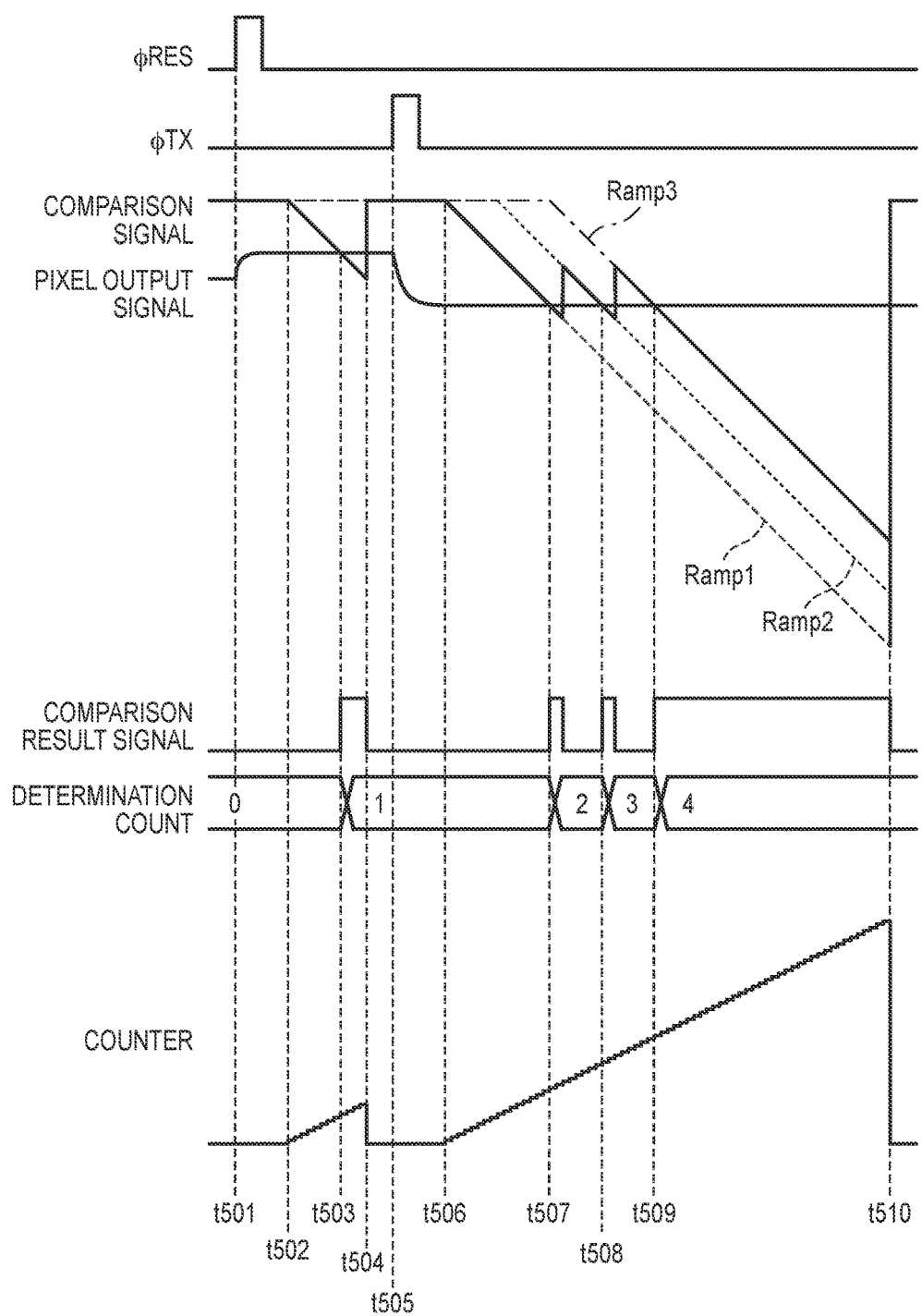
FIGS. 5A and 5B are timing charts each for explaining driving of the image capturing apparatus shown in FIG. 1.
Figure 5B:
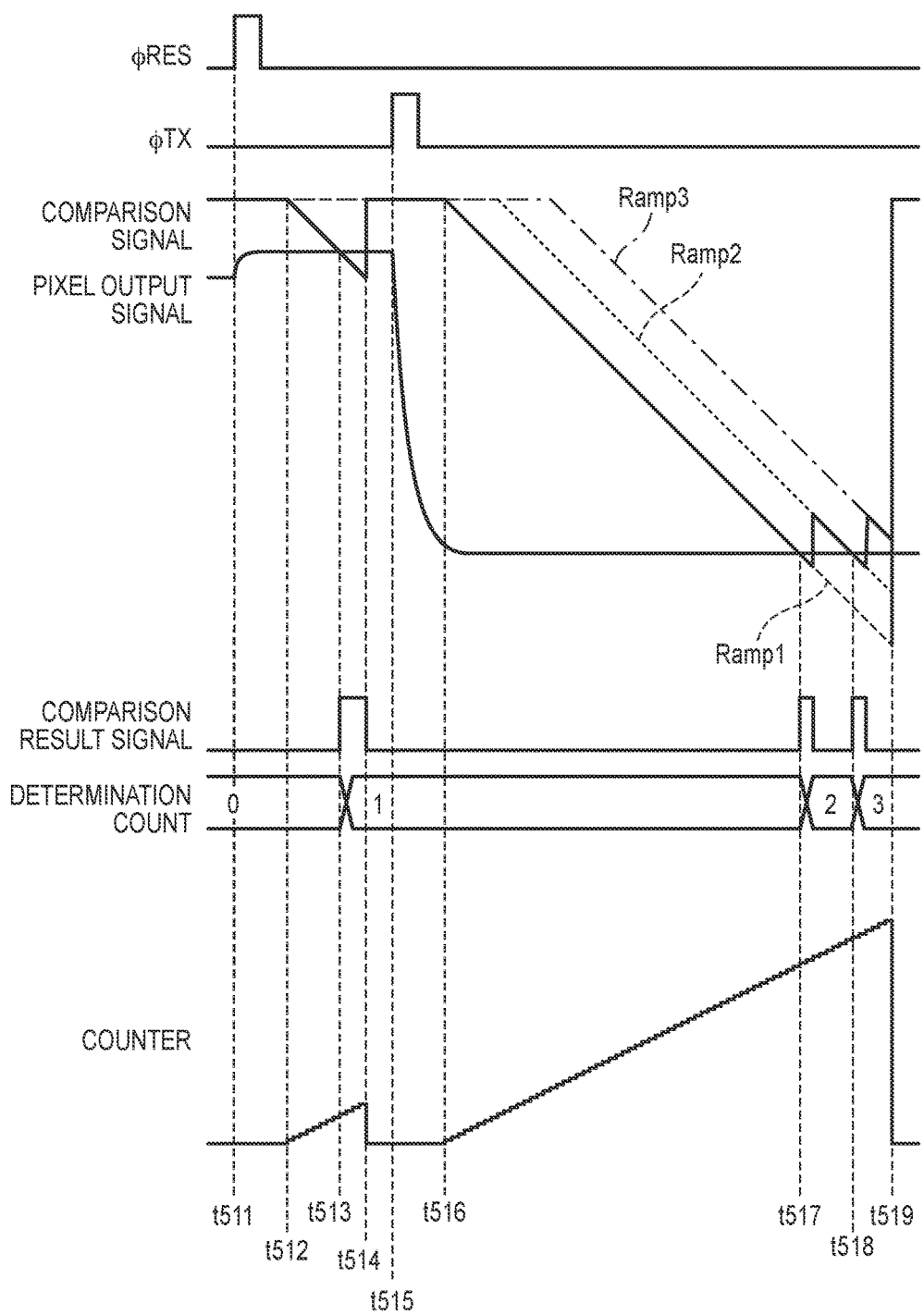

The driving method for the image capturing apparatus 100 according to this embodiment will be described next with reference to FIGS. 5A and 5B. FIGS. 5A and 5B are timing charts each showing driving of the image capturing apparatus 100. FIGS. 5A and 5B each show readout driving of reading out signals from each of the pixels on one row among the plurality of pixels 101 included in the pixel array 104. By repeatedly executing readout driving for the respective rows, the signals of all the pixels 101 included in the pixel array 104 are output outside the image capturing apparatus 100.

Referring to FIGS. 5A and 5B, "φRES" and "φTX" indicate the driving pulses φRES and φTX supplied to each of the pixels 101 on the row to be read out, and are set at high level or low level. A "comparison signal" indicates the reference signal used as the comparison signal input to the comparator 401 and switched by the switch 402. A "pixel output signal" indicates the S signal and N signal output from the pixel 101 and input to the comparator 401 via the vertical output line 102.

A "comparison result signal" indicates the output of the comparator 401. If the S signal or N signal has an electric potential higher than that of the comparison signal, the output of the comparator 401 is high level. A "determination count" indicates the output of the determination count counter 403, and schematically represents a case in which the determination count is switched. A "counter" indicates the count value as the output of the counter 108. The comparison signal, the pixel output signal, the comparison result signal, the determination count, and the counter show an example of one pixel 101 of the pixel array 104. FIG. 5A shows an operation when the electric potential of the S signal is high, that is, the signal level of the S signal is low. FIG. 5B shows an operation when the electric potential of the S signal is low, that is, the signal level of the S signal is high.

The operation when the signal level of the S signal is low, as shown in FIG. 5A, will be described first. At time t501, the driving pulse φRES is set at high level, and the electric potential of the FD 303 is reset. After that, the driving pulse φRES is set at low level, and reset of the FD 303 ends.

At time t502, the AD conversion period of the N signal as a signal before transferring charges accumulated by photoelectric conversion starts. Since the determination count is 0, Ramp1 is selected by the switch 402 as the comparison signal from the reference signals, and input to the comparator 401. After Ramp1 is selected as the comparison signal, the electric potential of Ramp1 starts to decrease at a constant change rate with time in accordance with the start of AD conversion of the N signal. At the same time, the counter 108 starts to count up.

At time t503, the magnitude relationship between the N signal and the comparison signal is inverted from that at the start of AD conversion of the N signal, and the comparison result signal changes to high level. Accordingly, the count value is held in the N signal latch 405, and the output of the determination count counter 403 becomes 1. Since the determination count is 1, the switch 402 does not switch the reference signal to be used as the comparison signal, and the reference signal Ramp1 is continuously used as the comparison signal.

At time t504, the AD conversion period of the N signal ends, and the electric potential of the reference signal Ramp1 as the comparison signal and the count value of the counter 108 are reset.

At time t505, the driving pulse φTX is set at high level, and the charges photoelectrically converted and accumulated by the PD 301 are transferred to the FD 303. Consequently, the electric potential of the FD 303 decreases in accordance with the transferred charges, and the S signal of the pixel output signals input to the comparator 401 also decreases in accordance with the electric potential of the FD 303.

At time t506, the AD conversion period of the S signal starts. The electric potential of Ramp1 starts to decrease at a constant change rate in accordance with the start of AD conversion of the S signal. At this time, the reference signal used as the comparison signal is Ramp1 that is the same as that when performing AD conversion of the N signal. Therefore, the electric potential decreases at the same change rate with time as that when performing AD conversion of the N signal. At the same time, the counter 108 starts to count up.

Furthermore, in the signal generator 107, the electric potential of Ramp2 starts to change to follow Ramp1 with a delay of a preset time after time t506 at which AD conversion starts and the electric potential of Ramp1 starts to change. Similarly, the electric potential of Ramp3 starts to change by following Ramp2 with a delay of a preset time after the electric potential of Ramp2 starts to change. The electric potentials of Ramp1, Ramp2, and Ramp3 can be controlled to change at the same change rate with time.

The time by which the start of the change of the electric potential of Ramp2 is delayed with respect to Ramp1 and the time by which the start of the change of the electric potential of Ramp3 is delayed with respect to Ramp2 are set to fall within a range where when switching the reference signal as the comparison signal, the reference signal after switching has an electric potential higher than that of the pixel output signal (S signal). Furthermore, the time by which the start of the change of the electric potential is delayed is set shorter than the AD conversion period (a period from time t506 to time t510) of the S signal. More specifically, the shortest time within which the reference signal reliably has an electric potential higher than that of the S signal at the time of switching of the reference signal may be obtained and set. Furthermore, for example, the time from the start of the change of the electric potential of Ramp1 to the start of the change of the electric potential of Ramp2 may be equal to the time from the start of the change of the electric potential of Ramp2 to the start of the change of the electric potential of Ramp3, as shown in FIGS. 5A and 5B.

At time t507, the magnitude relationship between the S signal and the comparison signal is inverted from that at the start of AD conversion of the S signal, and the comparison result signal changes to high level. Accordingly, the count value is held as S signal value A in the S signal latch A 406, and the output of the determination count counter 403 becomes 2. In accordance with the change of the determination count to 2, the switch 402 switches the reference signal to be used as the comparison signal from Ramp1 to Ramp2. Since the electric potential of Ramp2 changes with a delay with respect to Ramp1, as described above, the comparison signal is switched to have a higher electric potential by the change amount of the electric potential of Ramp1 during the period by which the change of the electric potential of Ramp2 is delayed with respect to Ramp1. Consequently, the magnitude relationship between the S signal and the comparison signal returns to that at the start of AD conversion, and the comparison result signal is set at low level.

At time t508, the magnitude relationship between the S signal and the comparison signal is inverted again from that at the start of AD conversion of the S signal, and the comparison result signal changes to high level. Accordingly, the count value is held as S signal value B in the S signal latch B 407, and the output of the determination count counter 403 becomes 3. In accordance with the change of the determination count to 3, the switch 402 switches the reference signal to be used as the comparison signal from Ramp2 to Ramp3. Since the electric potential of Ramp3 changes with a delay with respect to Ramp2, as described above, the comparison signal is switched to have a higher electric potential by the change amount of the electric potential of Ramp2 during the period by which the change of the electric potential of Ramp3 is delayed with respect to Ramp2. Consequently, the magnitude relationship between the S signal and the comparison signal returns to that at the start of AD conversion, and the comparison result signal is set at low level.

At time t509, the magnitude relationship between the S signal and the comparison signal is inverted from that at the start of AD conversion of the S signal, and the comparison result signal changes to high level. Accordingly, the count value is held as S signal value C in the S signal latch C 408, and the output of the determination count counter 403 becomes 4. Since the determination count is 4 at this time, Ramp3 is continuously input to the comparator 401 as the comparison signal.

At time t510, the AD conversion period of the S signal ends, and the electric potentials of Ramp1, Ramp2, and Ramp3 and the count value of the counter 108 are reset.

After that, in accordance with the driving pulses output from the horizontal scanning circuit 112, the N signal value and S signal values A to C as the AD conversion results held in the counter 404 of the converter 106, and the determination count of the determination count counter 403 are sequentially output to the output circuit 110.

The output circuit 110 performs reference level correction of subtracting the reference value as the AD conversion result of the N signal from the signal value as the AD conversion result of the S signal. By subtracting the reference value from the signal value, a signal based on the charges accumulated in the pixel 101 is calculated.

Since the timings at which the electric potentials of Ramp1, Ramp2, and Ramp3 each used as the comparison signal start to decrease are different, the relationships between the held count values and the electric potentials of the S signals shift. To correct the shift, the output circuit 110 performs offset correction of subtracting, from each of S signal values B and C obtained by performing AD conversion using each of Ramp2 and Ramp3 as the comparison signal, the count value that has increased during the time by which the start of the change of the electric potential of each reference signal is delayed. More specifically, the output circuit 110 corrects S signal value B in accordance with the time from the start of comparison between the comparison signal and the S signal at time t506, that is, the start of the change of the electric potential of Ramp1 as the start of AD conversion of the S signal to the start of the change of the electric potential of Ramp2. Similarly, the output circuit 110 corrects S signal value C in accordance with the delay time from the start of AD conversion of the S signal at time t506 (the start of the change of the electric potential of Ramp1) to the change of the electric potential of Ramp3.

Furthermore, although the electric potentials of Ramp1, Ramp2, and Ramp3 are controlled to change at the same change rate with time, it is difficult to correctly make the change rates equal to each other. To correct the error, the output circuit 110 performs gain correction for S signal values B and C. Furthermore, the output circuit 110 averages the three signal values having undergone offset correction and gain correction, and outputs the result as the output of the pixel to the outside of the image capturing apparatus 100.

The operation when the signal level of the S signal is high, as shown in FIG. 5B, will be described next. The difference from the above-described operation when the signal level of the S signal is low will be explained and a description of the AD conversion period of the N signal will be omitted.

At time t515, the driving pulse φTX is set at high level, and the charges photoelectrically converted and accumulated by the PD 301 are transferred to the FD 303. The pixel output signal (S signal) changes to an electric potential lower than that when the signal level is low.

At time t517, the magnitude relationship between the S signal and the comparison signal is inverted from that at the start of AD conversion of the S signal, and S signal value A is held in the S signal latch A 406. In accordance with the change of the output of the determination count counter 403 to 2, the switch 402 switches the reference signal to be used as the comparison signal from Ramp1 to Ramp2. The timing at which the magnitude relationship between the S signal and Ramp1 used as the comparison signal is inverted is later, as compared with a case in which the signal level is low.

At time t518, the magnitude relationship between the S signal and the comparison signal is inverted again from that at the start of AD conversion of the S signal, and S signal value B is held in the S signal latch B 407. In accordance with the change of the output of the determination count counter 403 to 3, the switch 402 switches the reference signal to be used as the comparison signal from Ramp2 to Ramp3.

At time t519, the AD conversion period of the S signal ends, and the electric potentials of Ramp1, Ramp2, and Ramp3 and the count value of the counter 108 are reset.

After that, in accordance with the driving pulses output from the horizontal scanning circuit 112, the N signal value and S signal values A and B as the AD conversion results held in the counter 404 of the converter 106, and the determination count of the determination count counter 403 are sequentially output to the output circuit 110.

Since the determination count is not "4" when the signal level is low but "3", the output circuit 110 performs the same correction processing and averaging processing as the above-described processes for S signal values A and B. The output circuit 110 outputs the averaged signal value as the output of the pixel to the outside of the image capturing apparatus 100.

A range within which the number of times AD conversion of the S signal is performed does not become the maximum number (three in this embodiment) depends on the time by which the start of the change of the electric potential of each reference signal is delayed but the delay time is much shorter than the AD conversion period. Therefore, AD conversion can be performed the maximum number of times at many signal levels. In this embodiment, the three kinds of signals, that is, Ramp1 and the two signals Ramp2 and Ramp3 whose electric potentials each change with a delay with respect to Ramp1 are used as the reference signals. The present invention, however, is not limited to this. AD conversion may be performed using four or more kinds of reference signals as comparison signals.

The two operations when the signal level is low and when the signal level is high have been exemplified with reference to FIGS. 5A and 5B. Signals of different signal levels can be respectively input to the plurality of converters 106 each arranged for each column of the pixel array 104. In each of the converters 106 that perform AD conversion at the same time, the timing at which the plurality of reference signals are switched as the comparison signal can change depending on the signal level of the input S signal. Therefore, AD conversion may be performed using Ramp2 as the comparison signal and performed using Ramp3 as the comparison signal sequentially from the converter 106 that has performed first AD conversion using Ramp1 as the comparison signal with the S signal. Furthermore, in accordance with the magnitude of the signal level of the S signal, the number of reference signals, among the plurality of reference signals, to be used as the comparison signals by the switch 402 can be different. Therefore, in accordance with the magnitude of the signal level of the S signal, the number of S signal values held by the counter 404 (the number of latches in each of which the S signal value is held) can be different, as described above.

Figure 6:
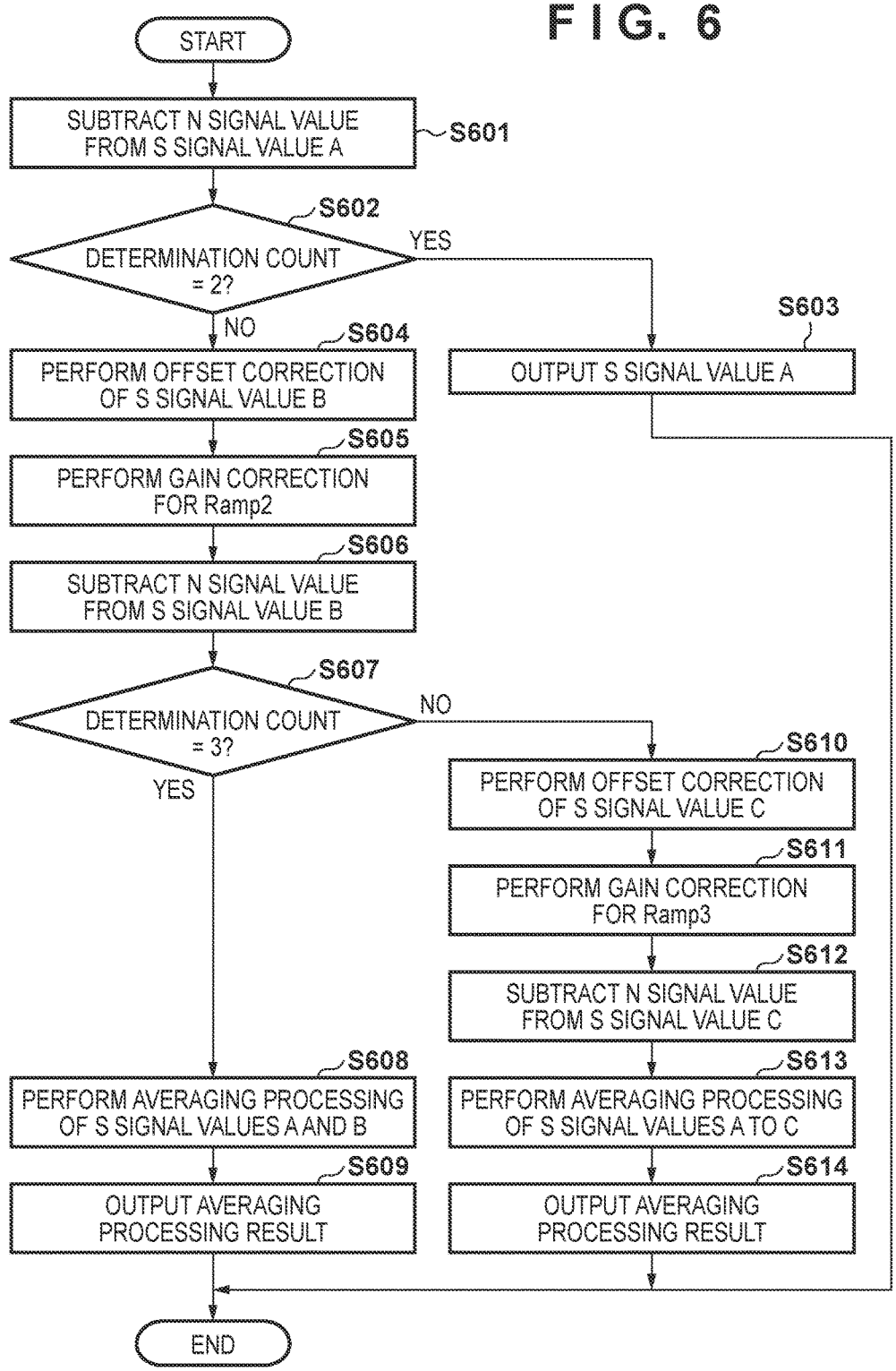
FIG. 6 is a flowchart for explaining the processing of an output circuit of the image capturing apparatus shown in FIG. 1.

The correction processing and averaging processing of the output circuit 110 according to this embodiment will be described next with reference to FIG. 6. FIG. 6 is a flowchart illustrating the processing when calculating the output of one pixel 101 included in the pixel array 104. The output circuit 110 outputs all signal values forming a captured image by repeatedly performing the processing for all the pixels 101 included in the pixel array 104.

In step S601, the output circuit 110 performs reference level correction of subtracting the N signal value as the reference value from S signal value A among the signal values. This can calculate a signal based on the charges photoelectrically converted and accumulated in the pixel 101 by light irradiation. In step S602, it is determined whether the determination count is 2. If the determination count is 2, the process shifts to step S603; otherwise, the process shifts to step S604.

If the determination count is 2, the output circuit 110 outputs, in step S603, as the output of the pixel, S signal value A obtained by subtracting the N signal value to the outside of the image capturing apparatus 100. If the determination count is 2, AD conversion of the S signal is performed only once. Therefore, only S signal value A is acquired as a signal value, and it is thus unnecessary to perform averaging processing.

If the determination count is not 2, the process advances to step S604, and the output circuit 110 performs offset correction of S signal value B. Offset correction is processing of correcting the shift of the relationship between the held count value and the electric potential of and S signal when using, for AD conversion, the reference signal for which the timing when the electric potential starts to decrease is delayed, as described above. More specifically, the count value that has increased during the time from the start of AD conversion (the start of the change of the electric potential of Ramp1) to the start of the change of the electric potential of Ramp2 is subtracted from S signal value B.

In step S605, the output circuit 110 performs gain correction when using Ramp2. The change rate of the electric potential of Ramp2 with time is controlled to be equal to that of the electric potential of Ramp1 with time. Since, however, Ramp1 and Ramp2 are transmitted from the signal generator 107 to the converter 106 using the different signal lines, it may be difficult to correctly make the change rates equal to each other. To correct the error, the output circuit 110 performs gain correction for S signal value B. If no gain correction is performed, an error in conversion gain may occur between AD conversion of the S signal using Ramp2 and AD conversion of the N signal using Ramp1, and it may be impossible to correctly calculate a signal value based on the accumulated charges. The number of times AD conversion of the S signal is performed can change depending on the signal level of the S signal. Therefore, by performing correction by gain correction so that the gain of AD conversion is constant regardless of the number of times AD conversion is performed, a signal value can be obtained more correctly over the pixel array 104. Gain correction is performed by applying, to S signal value B, a correction value recorded in advance in the memory of the output circuit 110. Gain correction may be performed by, for example, multiplying S signal value B by the correction value. The correction value can be acquired from the gain difference between S signal values A and B when inputting at least two kinds of signals of different electric potentials to the converter 106 and performing AD conversion in advance. The correction value used for gain correction may be recorded in the output circuit 110, as described above. Alternatively, for example, a correction value recorded in a correction value recorder 114 may be read out and used by the output circuit 110, as shown in FIG. 1.

In step S606, the output circuit 110 performs reference level correction of subtracting the N signal value from S signal value B having undergone offset correction and gain correction. This can calculate a signal based on the charges that have been AD-converted with a gain equal to that when performing AD conversion using Ramp1 as the comparison signal and accumulated in the pixel 101.

In step S607, it is determined whether the determination count is 3. If the determination count is 3, the process shifts to step S608. If the determination count is not 3, that is, the determination count is 4, the process shifts to step S610.

If the determination count is 3, the output circuit 110 performs, in step S608, processing of averaging corrected S signal values A and B. If the determination count is 3, AD conversion of the S signal is performed twice, and thus the signal values of S signal values A and B are acquired and averaged. With this averaging processing, the effect of reducing random circuit noise is obtained. Subsequently, in step S609, the output circuit 110 outputs the averaged signal value as the output of the pixel to the outside of the image capturing apparatus 100.

If the determination count is not 3, the process advances to step S610, and the output circuit 110 performs offset correction of S signal value C. The count value that has increased during the time from the start of AD conversion (the start of the change of the electric potential of Ramp1) to the start of the change of the electric potential of Ramp3 is subtracted from S signal value C.

In step S611, the output circuit 110 performs gain correction when using Ramp3. Gain correction is performed by applying, to S signal value C, a correction value recorded in advance in the memory of the output circuit 110. Gain correction may be performed by, for example, multiplying S signal value C by the correction value. The correction value can be acquired from the gain difference between S signal values A and C when inputting at least two kinds of signals of different electric potentials to the converter 106 and performing AD conversion in advance. The correction value used for gain correction may be recorded in the output circuit 110, as described above. Alternatively, for example, a correction value recorded in the correction value recorder 114 may be read out and used by the output circuit 110, as shown in FIG. 1.

In step S612, the output circuit 110 performs reference level correction of subtracting the N signal value from S signal value C having undergone offset correction and gain correction. This can calculate a signal based on the charges that have been AD-converted with a gain equal to that when performing AD conversion using Ramp1 as the comparison signal and accumulated in the pixel 101.

In step S613, the output circuit 110 performs processing of averaging corrected S signal values A, B, and C. If the determination count is 4, AD conversion of the S signal is performed three times, and thus the three signal values are acquired and the output circuit 110 averages these signal values. With this averaging processing, the effect of reducing circuit noise is obtained. Subsequently, in step S614, the output circuit 110 outputs the averaged signal value as the output of the pixel to the outside of the image capturing apparatus 100.

In this embodiment, except that the signal level of the S signal is very high, it is possible to perform AD conversion for the S signal a plurality of times without extending the AD conversion period. It is possible to reduce circuit noise by performing AD conversion a plurality of times and averaging the acquired signal values in the output circuit 110.

In this embodiment, the signal generator 107 generates a reference signal whose electric potential changes at the start of AD conversion of the S signal as well as a reference signal whose electric potential changes with a delay of a preset time after the start of AD conversion. Thus, the electric potential of the comparison signal starts to change in accordance with the start of AD conversion of the S signal. After that, the reference signal to be used is switched in accordance with inversion of the magnitude relationship between the S signal and the comparison signal, and then the electric potential changes again from the electric potential between the electric potential at the start of AD conversion of the S signal and that at the time of the inversion of the magnitude relationship. In this way, when performing AD conversion, it is possible to shorten the time taken to perform the second AD conversion operation and subsequent AD conversion operations by successively performing the AD conversion operations while switching the reference signal to be used as the comparison signal. As described above, in this embodiment, the range of the signal level of the S signal within which AD conversion cannot be performed the maximum number of times depends on the time by which the start of the change of the electric potential of the reference signal is delayed but this time is much shorter than the AD conversion period. Therefore, AD conversion can be performed a plurality of times within the range of many signal levels.

During AD conversion, the signal level may change due to a dark current or the like. In this case, in the driving method described in Japanese Patent Laid-Open No. 2015-106816, the reference signal is swept for each AD conversion operation from a voltage at the start of the AD conversion operation, and thus the interval between periods during which AD conversion is performed becomes long, and the reliability of a signal value obtained by performing second or subsequent AD conversion may decrease, as compared with first AD conversion. On the other hand, if the arrangement of the image capturing apparatus and the driving method therefor according to this embodiment are used, the interval until the second or subsequent AD conversion is performed corresponds to only the time by which the start of the change of the electric potential of each reference signal is delayed. Therefore, the reliability of the signal value acquired by performing second or subsequent AD conversion can be improved.

In this embodiment, the signal generator 107 generates a plurality of reference signals, and the switch 402 generates a comparison signal by switching between the reference signals. However, a method of generating a comparison signal is not limited to this. For example, the signal generator 107 may generate, as a comparison signal, a signal whose electric potential starts to decrease in accordance with the start of AD conversion of the S signal, and changes again from the electric potential between the electric potential at the start of AD conversion of the S signal and that at the time of inversion of the magnitude relationship with the S signal in accordance with the inversion of the magnitude relationship. In this case, there can be one signal line between the signal generator 107 and the converter 106, and thus the above-described gain correction in the output circuit 110 may be omitted.

The arrangement of an image capturing apparatus and a driving method therefor according to another embodiment of the present invention will be described with reference to FIGS. 7A to 9. FIGS. 7A and 7B are a circuit diagram and a table for explaining a converter 106 included in an image capturing apparatus 100 according to a second embodiment of the present invention. FIG. 7A shows an example of the circuit arrangement of the converter 106 of the image capturing apparatus 100. FIG. 7B shows the relationship between a determination count and a reference signal selected as a comparison signal. In the image capturing apparatus 100 according to this embodiment, a circuit arrangement shown in FIG. 1 and the circuit arrangement of each pixel 101 shown in FIG. 3 may be the same as in the above-described first embodiment. The difference from the above-described first embodiment will mainly be explained.

The converter 106 according to this embodiment has the following four different points from the converter 106 according to the above-described first embodiment. The maximum determination count output from a determination count counter 703 increases to "6", as compared with "4" in the first embodiment. The determination count is not output outside the converter 106. The relationship between the determination count and a reference signal selected by a switch 702 is different from the first embodiment. There are six latches in total which form a counter 704, including an N signal latch A 705, an N signal latch B 706, an N signal latch C 707, an S signal latch A 708, an S signal latch B 709, and an S signal latch C 710. Except for these four points, the converter 106 according to this embodiment may be the same as that according to the first embodiment.

The first embodiment has explained the case in which AD conversion is performed once for the N signal, and AD conversion is performed for the S signal once to three times in accordance with the signal level. On the other hand, in this embodiment, AD conversion is performed for the N signal three times, and AD conversion is always performed for the S signal three times. Therefore, it is unnecessary to output the determination count to an output circuit 110. To perform AD conversion for the N signal three times, three N signal latches in total, that is, the N signal latch A 705, the N signal latch B 706, and the N signal latch C 707 are arranged in the counter 704. In addition, similarly to the first embodiment, three S signal latches in total, that is, the S signal latch A 708, the S signal latch B 709, and the S signal latch C 710 are arranged in the counter 704. The N signal latch A 705 and the S signal latch A 708 hold a signal value and a reference value obtained by AD-converting the N signal and the S signal using, as the comparison signal, Ramp1 among the reference signals, respectively. The N signal latch B 706 and the S signal latch B 709 hold a signal value and a reference value obtained by AD-converting the N signal and the S signal using, as the comparison signal, Ramp2 among the reference signals, respectively. The N signal latch C 707 and the S signal latch C 710 hold a signal value and a reference value obtained by AD-converting the N signal and the S signal using, as the comparison signal, Ramp3 among the reference signals, respectively.

The switch 702 uses, as the comparison signal, Ramp1 among the reference signals if the determination count is 0 or 3, Ramp 2 if the determination count is 1 or 4, and Ramp3 if the determination count is 3, 5, or 6. For the following description, the reference value held in the N signal latch A 705, that held in the N signal latch B 706, and that held in the N signal latch C 707 will be referred to as N signal value A, N signal value B, and N signal value C, respectively, hereinafter. In addition, similarly to the first embodiment, the signal value held in the S signal latch A 708, that held in the S signal latch B 709, and that held in the S signal latch C 710 will be referred to as S signal value A, S signal value B, and S signal value C, respectively, hereinafter.

Figure 8A:
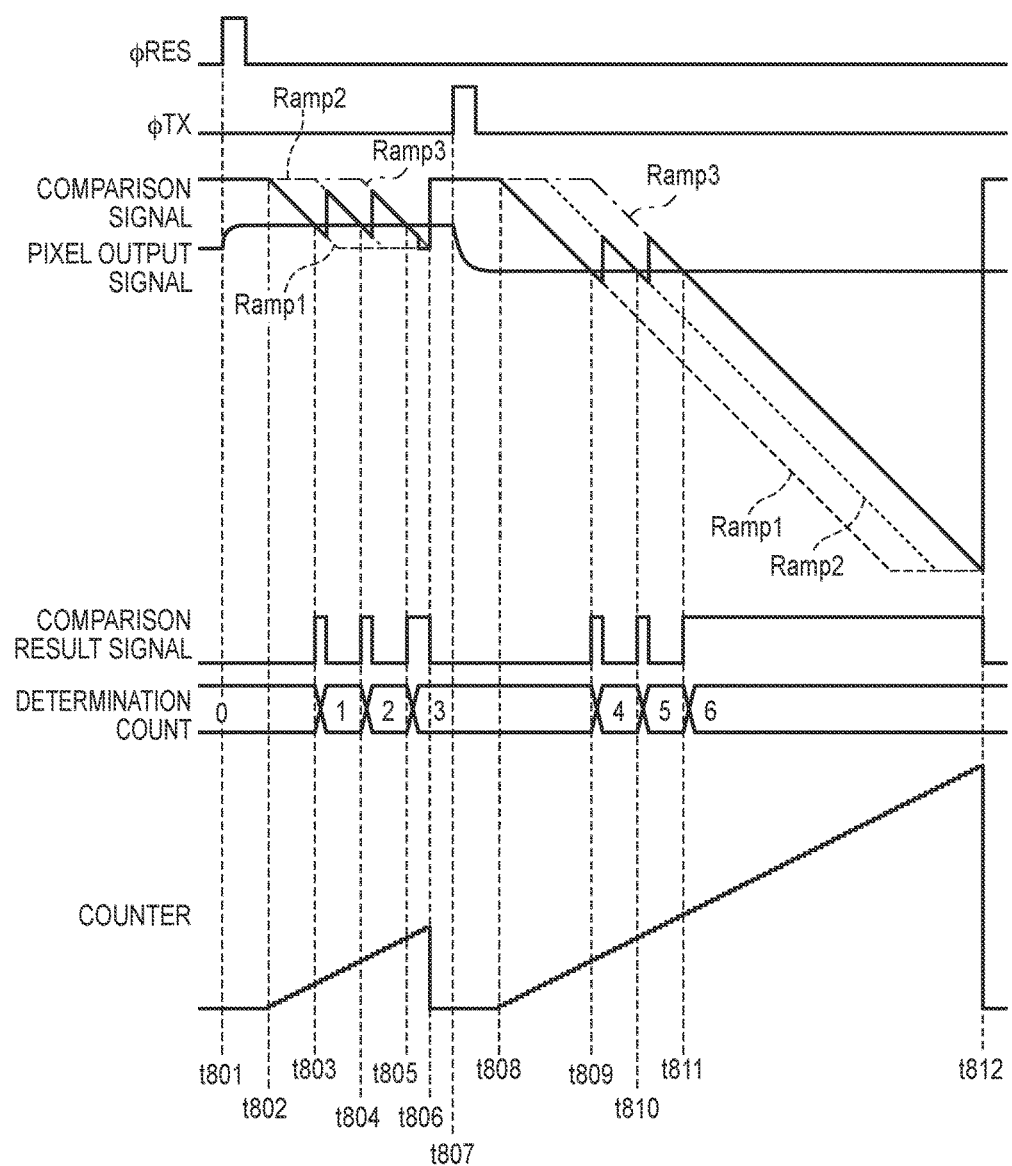
FIGS. 8A and 8B are timing charts each for explaining driving of the image capturing apparatus shown in FIG. 1.
Figure 8B:
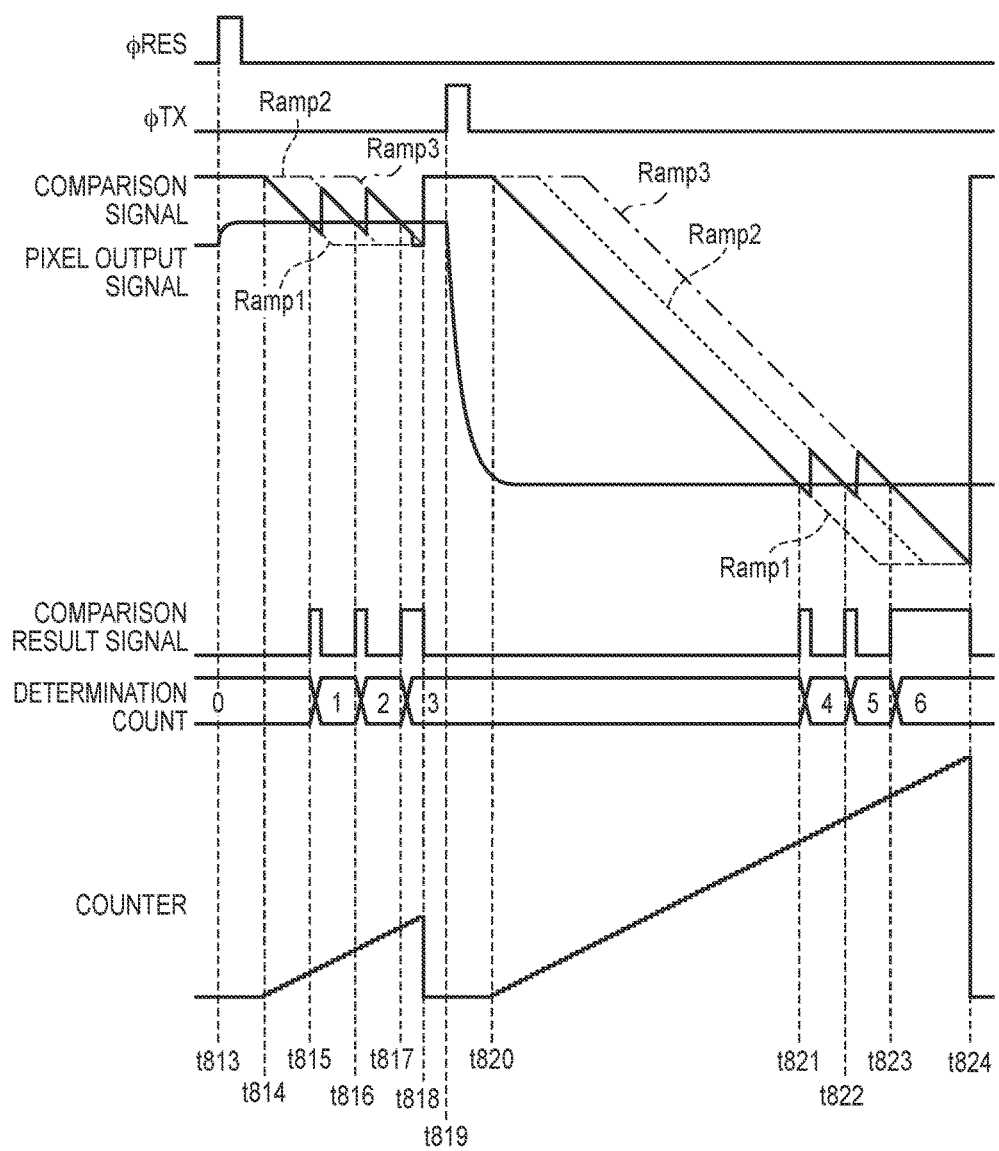

The driving method for the image capturing apparatus 100 according to this embodiment will be describe next with reference to FIGS. 8A and 8B. FIGS. 8A and 8B are timing charts each showing driving of the image capturing apparatus 100. FIG. 8A shows an operation when the electric potential of the S signal is high, that is, the signal level of the S signal is low. FIG. 8B shows an operation when the electric potential of the S signal is low, that is, the signal level of the S signal is high.

The operation when the signal level of the S signal is low, as shown in FIG. 8A, will be described first. Similarly to the first embodiment, at time t801, an FD 303 is reset.

At time t802, the AD conversion period of the N signal starts. At time t802, since the determination count of the determination count counter 703 is 0, Ramp1 is selected by the switch 702 and input to a comparator 701. After Ramp1 is selected as the comparison signal, the electric potential of Ramp1 starts to decrease at a constant change rate with time in accordance with the start of AD conversion of the N signal. At the same time, a counter 108 starts to count up.

A signal generator 107 starts AD conversion, and the electric potential of Ramp2 starts to change so as to follow Ramp1 with a delay of a preset time after time t802 at which the electric potential of Ramp1 starts to change. Similarly, the electric potential of Ramp3 starts to change by following Ramp2 with a delay of a preset time after the electric potential of Ramp2 starts to change. The electric potentials of Ramp1, Ramp2, and Ramp3 can be controlled to change at the same change rate with time.

At time t803, the magnitude relationship between the N signal and the comparison signal is inverted from that at the start of AD conversion of the N signal, and a comparison result signal changes to high level. Accordingly, the count value is held as N signal value A in the N signal latch A 705, and the output of the determination count counter 703 becomes 1. In accordance with the change of the determination count to 1, the switch 702 switches the reference signal to be used as the comparison signal from Ramp1 to Ramp2. Since the electric potential of Ramp2 changes with a delay with respect to Ramp1, as described above, the comparison signal is switched to have a higher electric potential by the change amount of the electric potential of Ramp1 during the period by which the change of the electric potential of Ramp2 is delayed with respect to Ramp1. Consequently, the magnitude relationship between the N signal and the comparison signal returns to that at the start of AD conversion, and the comparison result signal is set at low level.

At time t804, the magnitude relationship between the N signal and the comparison signal is inverted again from that at the start of AD conversion of the N signal, and the comparison result signal changes to high level. Accordingly, the count value is held as N signal value B in the N signal latch B 706. In accordance with the change of the determination count to 2, the switch 702 switches the reference signal to be used as the comparison signal from Ramp2 to Ramp3. Since the electric potential of Ramp3 changes with a delay with respect to Ramp2, as described above, the comparison signal is switched to have a higher electric potential by the change amount of the electric potential of Ramp2 during the period by which the change of the electric potential of Ramp3 is delayed with respect to Ramp2. Consequently, the magnitude relationship between the N signal and the comparison signal returns to that at the start of AD conversion, and the comparison result signal is set at low level.

At time t805, the magnitude relationship between the N signal and the comparison signal is inverted again from that at the start of AD conversion of the N signal, and the comparison result signal changes to high level. Accordingly, the count value is held as N signal value C in the N signal latch C 707. In accordance with the change of the determination count to 3, the switch 702 switches the reference signal to be used as the comparison signal from Ramp3 to Ramp1.

At time t806, the AD conversion period of the N signal ends, and the electric potentials of Ramp1, Ramp2, and Ramp3 and the count value of the counter 108 are reset.

During a period from time t807 to time 812, charges generated in the PD 301 by photoelectric conversion are transferred and AD conversion of the S signal is performed. In AD conversion of the S signal, the time from the start of AD conversion (the start of the change of the electric potential of Ramp1) to the start of the change of the electric potential of Ramp2 or Ramp3 can be controlled to be equal to the time by which the start of the change of the electric potential of Ramp2 or Ramp3 is delayed after the start of AD conversion in AD conversion of the N signal.

Unlike the above-described first embodiment, in this embodiment, the electric potential of Ramp3 used as the comparison signal changes until the magnitude relationship is inverted, regardless of the level of the S signal. In other words, a period from the start of AD conversion until the magnitude relationship between the electric potential of Ramp3 and the maximum level of the S signal is inverted corresponds to the period of AD conversion. This makes it possible to perform AD conversion for the S signal three times in the entire region of the signal level at which AD conversion is performed. For example, as shown in FIG. 8B, even if the signal level of the S signal is high, AD conversion is performed for the S signal three times.

Figure 9:
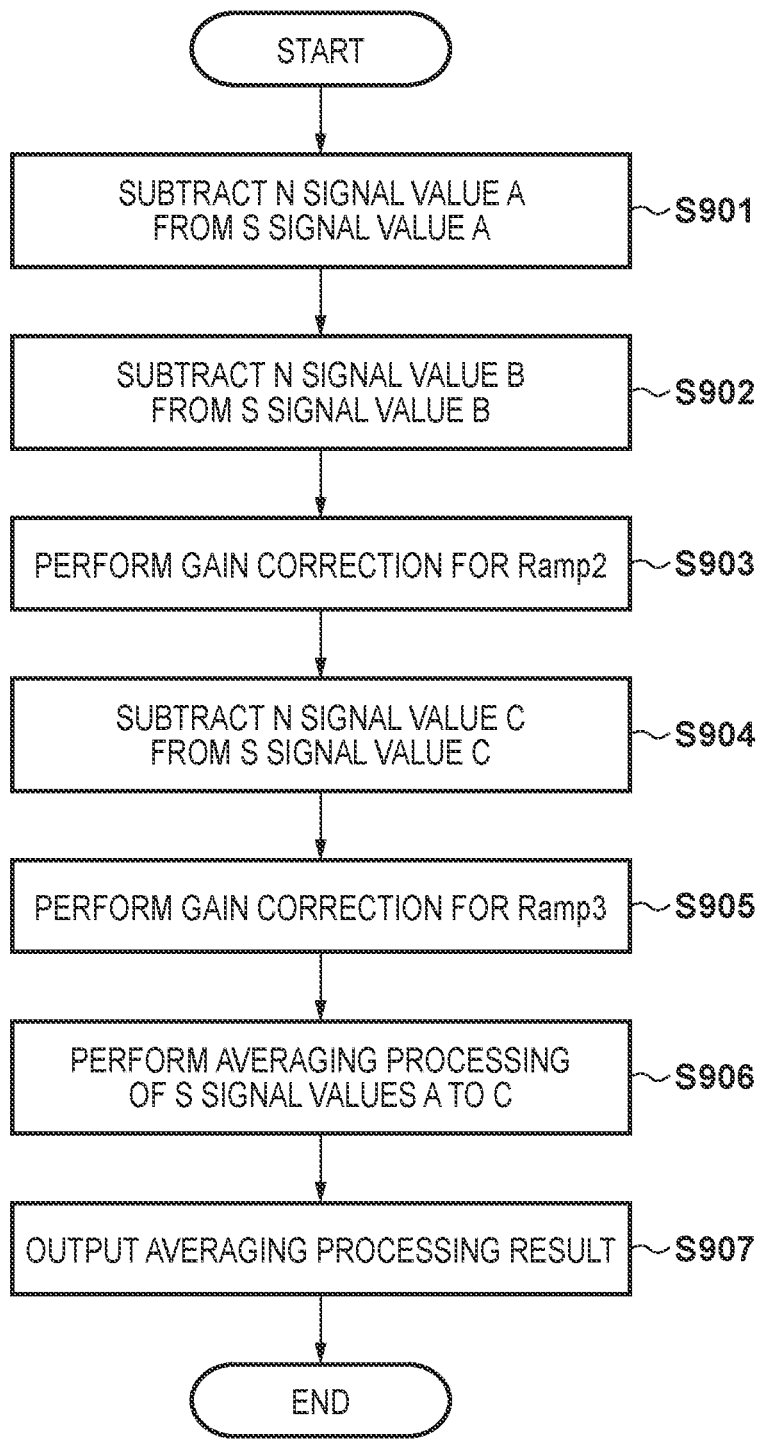
FIG. 9 is a flowchart for explaining the processing of an output circuit of the image capturing apparatus shown in FIG. 1.

The correction processing and averaging processing of the output circuit 110 according to this embodiment will be described next with reference to FIG. 9. FIG. 9 is a flowchart illustrating processing when the output of one pixel 101 included in a pixel array 104 is calculated. The output circuit 110 outputs all signal values forming a captured image by repeatedly performing the processing for all the pixels 101 included in the pixel array 104.

In step S901, the output circuit 110 performs reference level correction of subtracting N signal value A from S signal value A obtained by performing AD conversion using Ramp1 as the comparison signal. This can calculate a signal based on the charges photoelectrically converted and accumulated in the pixel 101.

In step S902, the output circuit 110 performs reference level correction of subtracting N signal value B from S signal value B obtained by performing AD conversion using Ramp2 as the comparison signal. This can calculate a signal based on the charges photoelectrically converted and accumulated in the pixel 101. In step S903, the output circuit 110 performs gain correction when using Ramp2 to correct an error in the temporal change rate of the electric potential of Ramp2 with respect to Ramp1. Gain correction is performed by applying, to S signal value B, a correction value recorded in advance in the output circuit 110. Gain correction may be performed by, for example, multiplying S signal value B by the correction value. The correction value can be acquired from the gain difference between S signal values A and B obtained after capturing a uniform luminance surface in advance and subtracting N signal values A and B, respectively. The correction value used for gain correction may be recorded in the memory of the output circuit 110, as described above. Alternatively, for example, a correction value recorded in a correction value recorder 114 may be read out and used by the output circuit 110, as shown in FIG. 1.

In step S904, the output circuit 110 performs reference level correction of subtracting N signal value C from S signal value C obtained by performing AD conversion using Ramp3 as the comparison signal. This can calculate a signal based on the charges photoelectrically converted and accumulated in the pixel 101. In step S905, the output circuit 110 performs gain correction when using Ramp3 to correct an error in the temporal change rate of the electric potential of Ramp3 with respect to Ramp1. Gain correction is performed by applying, to S signal value C, the correction value recorded in advance in the output circuit 110. Gain correction may be performed by, for example, multiplying S signal value C by the correction value. The correction value can be acquired from the gain difference between S signal values A and C obtained after capturing a uniform luminance surface in advance and subtracting N signal values A and C, respectively.

In step S906, the output circuit 110 performs processing of averaging the corrected S signal values A, B, and C. In this embodiment, since AD conversion of the S signal is performed three times, three signal values are acquired and averaged. With this averaging processing, the effect of reducing circuit noise is obtained. Subsequently, in step S907, the output circuit 110 outputs the averaged signal value as the output of the pixel to the outside of the image capturing apparatus 100.

In this embodiment, regardless of the magnitude of the signal level of the S signal, AD conversion is performed for the N signal three times and for the S signal three times. Therefore, similarly to the above-described first embodiment, even in a status in which a dark current or the like is generated, it is possible to obtain the noise reduction effect. Furthermore, by performing AD conversion for the N signal a plurality of times, it is possible to improve the noise reduction effect, as compared with the first embodiment. In addition, in this embodiment, when performing reference level correction, AD conversion is performed for the S signal value and N signal value using a common reference signal. Since the time from the start of AD conversion as a reference (the start of a decrease in electric potential of Ramp1) until the electric potential of each reference signal changes is common, it is unnecessary to perform offset correction.

In this embodiment, the output circuit 110 performs gain correction for each of S signal values B and C. Since, however, the S signal value and N signal value when performing reference level correction undergo AD conversion using the common reference signal, the change rates at which the electric potentials change with time are equal to each other. Furthermore, since the numbers of times AD conversion is performed are always equal to each other, gain correction may be omitted.

In this embodiment, the AD conversion period extends by the time by which the start of a change of the electric potential of the reference signal is delayed, as compared with the first embodiment. However, the time by which the change of the electric potential is delayed can be much shorter than the time of the whole AD conversion period. Thus, the influence of the extension of the AD conversion period is small. Furthermore, in this embodiment, AD conversion is performed for the N signal three times and for the S signal three times. However, AD conversion may be performed twice or four or more times. For example, the number of times AD conversion is performed is appropriately selected in consideration of the relationship between the effect of reducing random noise and the AD conversion period.

Figure 10:
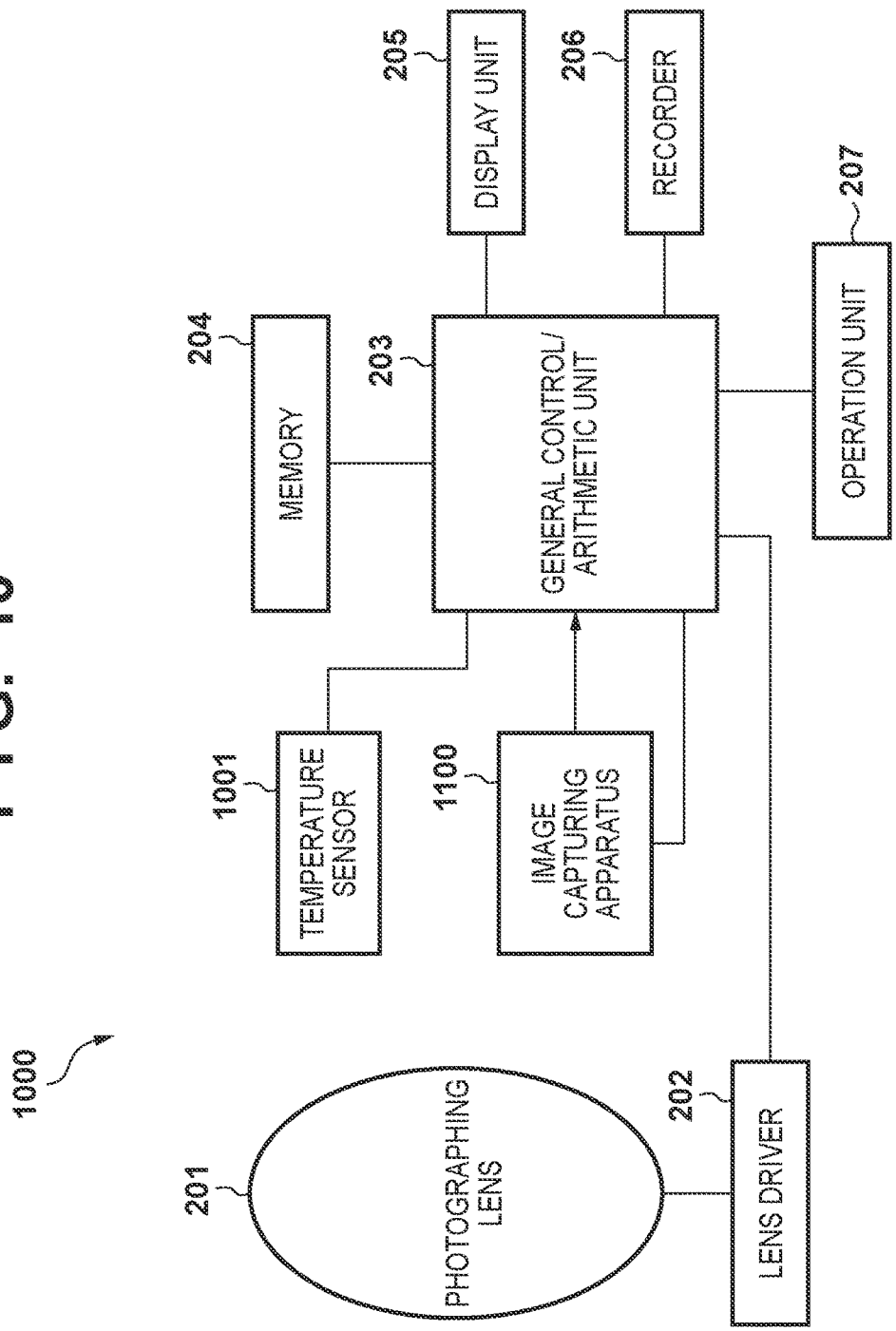
FIG. 10 is a block diagram showing a modification of the arrangement of the image capturing system shown in FIG. 2.

The arrangement of an image capturing apparatus and a driving method therefor according to still another embodiment of the present invention will be described with reference to FIGS. 10 to 13B. FIG. 10 shows an example of the arrangement of an image capturing system 1000 (for example, a digital camera) incorporating an image capturing apparatus 1100 according to a third embodiment of the present invention. The image capturing system 1000 according to this embodiment is different from the image capturing system 200 shown in FIG. 2 described above in that a temperature sensor 1001 is arranged. Except for this, the image capturing system 1000 may be the same as the image capturing system 200 shown in FIG. 2.

The temperature sensor 1001 detects the temperature of the image capturing apparatus 1100, and transmits temperature information to a general control/arithmetic unit 203. The general control/arithmetic unit 203 transmits the temperature information to the image capturing apparatus 1100. The image capturing apparatus 1100 controls generation of reference signals in a signal generator 107 in accordance with the received temperature information.

The circuit arrangement of the image capturing apparatus 1100 according to this embodiment will be described next with reference to FIG. 11. As compared with the image capturing apparatus 100 shown in FIG. 1 described above, an amplifier 1102 including a plurality of column amplifiers 1101 is arranged in the image capturing apparatus 1100 according to this embodiment. Except for this, the image capturing apparatus 1100 may be the same as the image capturing apparatus 100 shown in FIG. 1.

Each column amplifier 1101 of the amplifier 1102 is arranged between a converter 106 and a vertical output line 102 to which a signal is output from a pixel array 104. Each column amplifier 1101 of the amplifier 1102 amplifies an N signal or an S signal output from a corresponding pixel 101, and outputs them to an AD converter 109. Each column amplifier 1101 is configured to change an amplification factor when amplifying the N signal or S signal. In this embodiment, an amplification factor of 1, 2, 4, or 8 can be selected. The amplification factor and its type are not limited to them, and may be appropriately set depending on the image capturing apparatus.

A controller 113 outputs a driving signal ϕRAMP_START of a different timing to the signal generator 107 in accordance with three image acquisition conditions of the temperature information received from the general control/arithmetic unit 203, the amplification factor of each column amplifier 1101 of the amplifier 1102, and the change rage of the electric potential of the reference signal. The setting of the amplification factor of each column amplifier 1101 of the amplifier 1102 and the setting of the change rate of the electric potentials of Ramp1, Ramp2, and Ramp3 are designated by the user and transmitted from the general control/arithmetic unit 203 to the controller 113. The signal generator 107 generates Ramp1, Ramp2, and Ramp3 as reference signals so that the electric potentials of Ramp1, Ramp2, and Ramp3 start to change with delays of preset times in accordance with the timing of the driving signal ϕRAMP_START according to the image acquisition conditions. In this embodiment, the signal generator 107 can change a conversion gain between the amplitude of the S signal and a digital signal after AD conversion by changing the change rate of the electric potentials of Ramp1, Ramp2, and Ramp3. An output circuit 110 changes a correction value to be used for offset correction to an appropriate value in accordance with a change in timing of the start of the change of the electric potential of Ramp2 or Ramp3 in the signal generator 107.

Figure 12A:
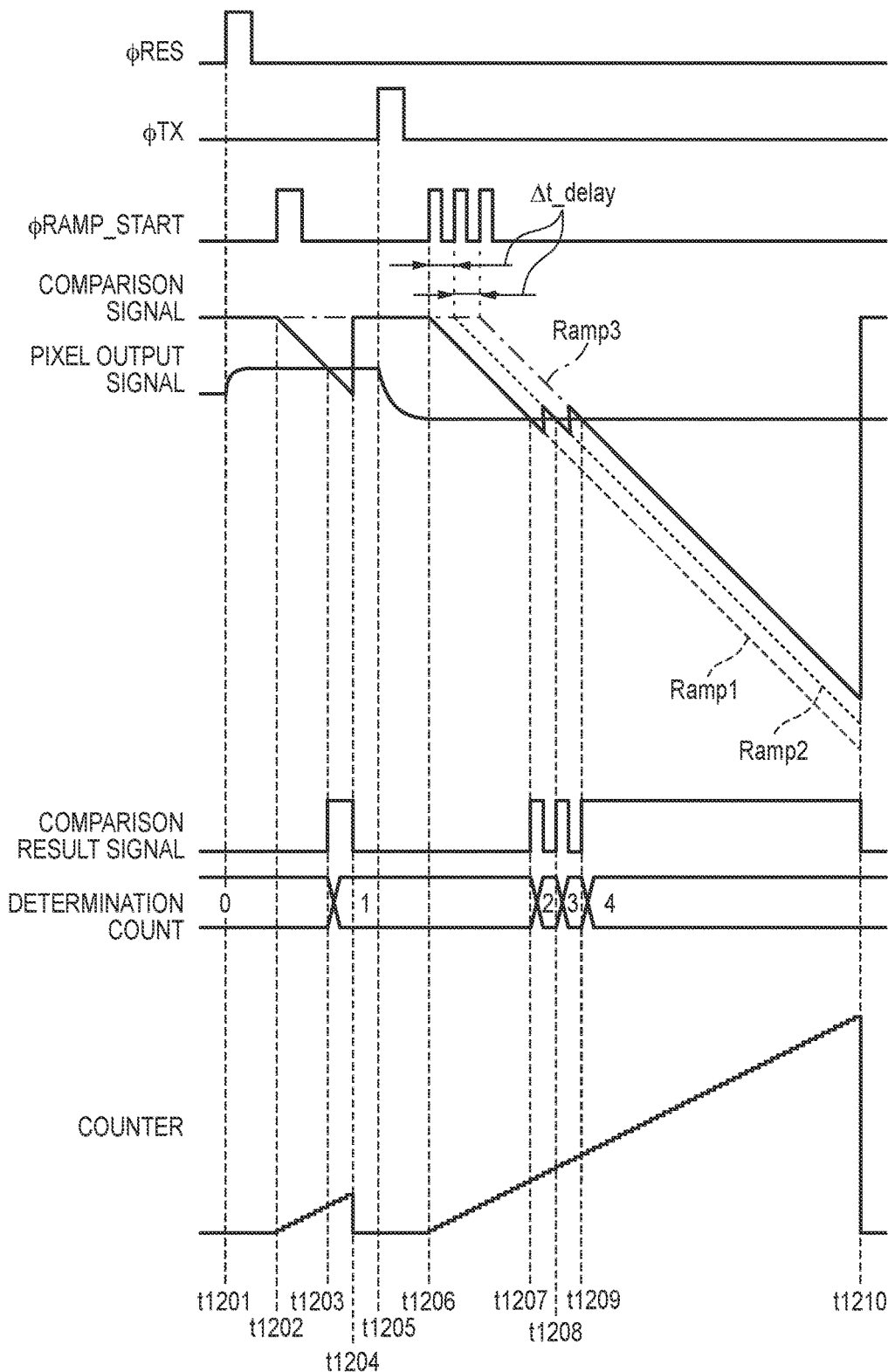
FIGS. 12A to 12C are timing charts each for explaining driving of the image capturing apparatus shown in FIG. 11.
Figure 12B:
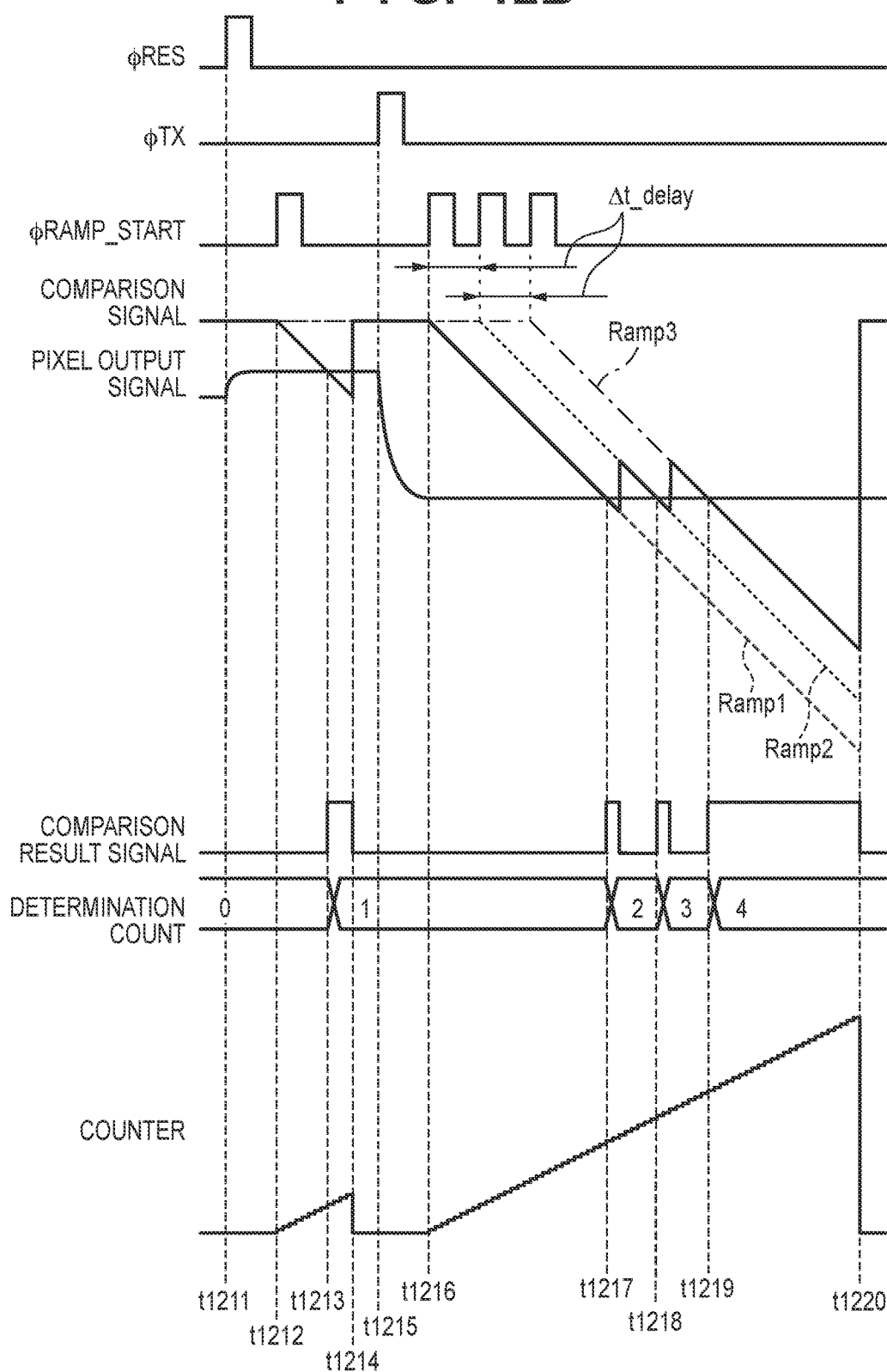
Figure 12C:
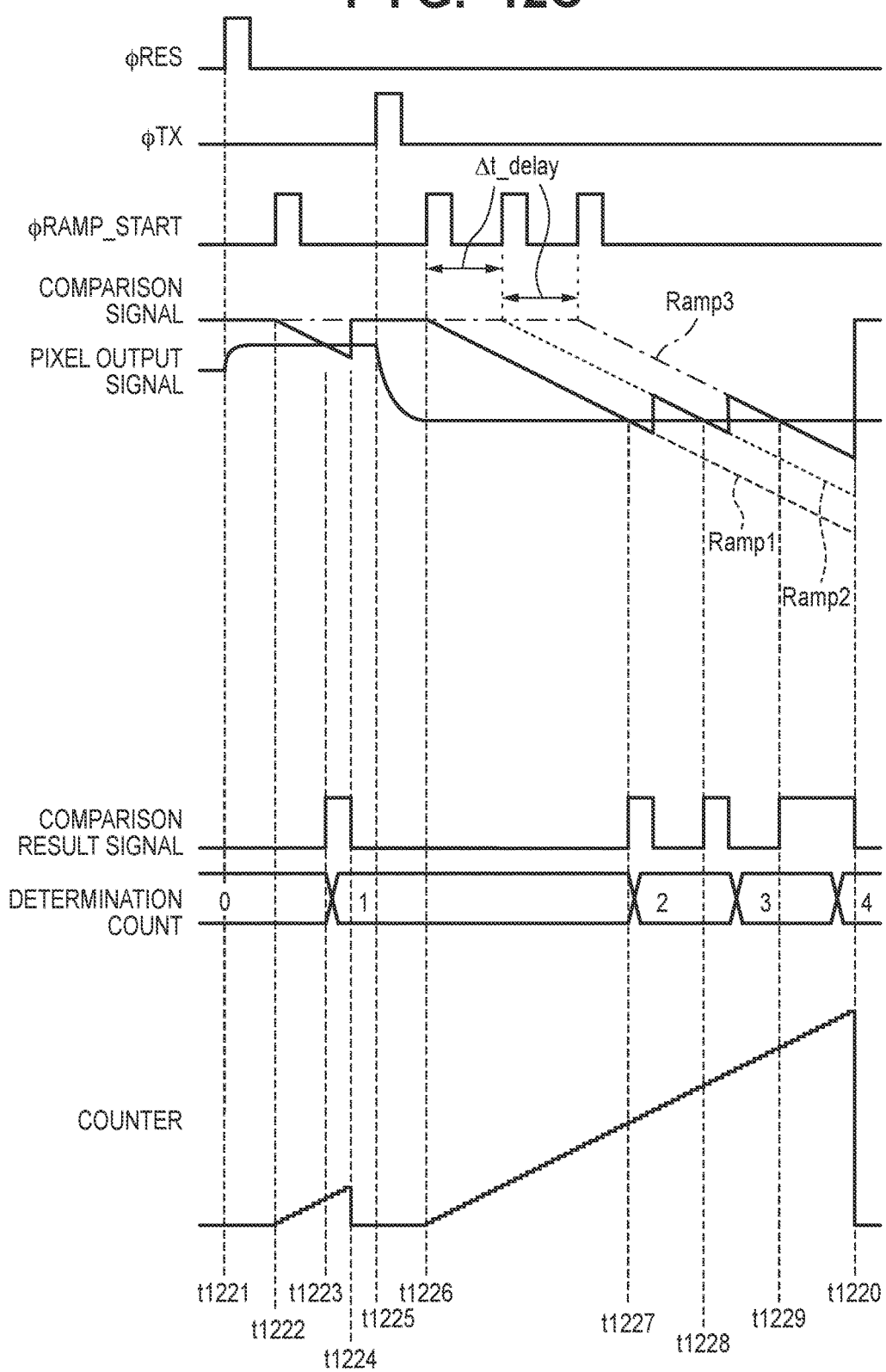

FIGS. 12A to 12C are timing charts each showing driving of the image capturing apparatus 1100. FIG. 12A shows an operation when the temperature of the image capturing apparatus 1100 is 20° C., the amplification factor of each column amplifier 1101 of the amplifier 1102 is 4, and the change rate of the electric potential of the reference signal is high. FIG. 12B shows an operation when the temperature of the image capturing apparatus 1100 is 50° C., the amplification factor of each column amplifier 1101 of the amplifier 1102 is 4, and the change rate of the electric potential of the reference signal is high. FIG. 12C shows an operation when the temperature of the image capturing apparatus 1100 is 50° C., the amplification factor of each column amplifier 1101 of the amplifier 1102 is 4, and the change rate of the electric potential of the reference signal is low. The relationship between the image acquisition conditions and the timing of the driving signal ϕRAMP_START will be described later with reference to another drawing.

As shown in FIGS. 12A to 12C, the signal generator 107 causes the electric potentials of Ramp1, Ramp2, and Ramp3 as reference signals to start to change in accordance with the pulse of the driving signal ϕRAMP_START transmitted from the controller 113. In readout driving, the signal generator 107 causes the electric potential of Ramp1 to start to change by the first pulse, and causes the electric potentials of Ramp1, Ramp2, and Ramp3 to start to change by the second, third, and fourth pulses input after the end of AD conversion of the N signal, respectively. In controlling the driving signal ϕRAMP_START, the controller 113 outputs the third pulse after a delay time Δt_delay elapses since the second pulse in accordance with the image acquisition conditions. Furthermore, in controlling the driving signal ϕRAMP_START, the controller 113 outputs the fourth pulse after the delay time Δt_delay elapses since the third pulse in accordance with the image acquisition conditions. The controller 113 outputs each pulse of the driving signal ϕRAMP_START so that the delay time Δt_delay changes in accordance with the image acquisition conditions. In response to this, the signal generator 107 generates Ramp2 so that it starts to change with a delay of a time preset in accordance with the image acquisition conditions after the start of the change of Ramp1, with respect to Ramp1 to Ramp3 as reference signals. The signal generator 107 generates Ramp3 so that it starts to change with a delay of a time preset in accordance with the image acquisition conditions after the start of the change of Ramp2. In this way, by changing the delay time Δt_delay in accordance with the image acquisition conditions, it is possible to control, to a different electric potential, the electric potential difference between the electric potential of the preceding reference signal and that of the succeeding reference signal when switching the reference signal to be used as the comparison signal in AD conversion of the S signal. This suppresses, when switching the reference signal to be used as the comparison signal, the switched reference signal from changing from an electric potential lower than that of the S signal (the magnitude relationship between the electric potentials is not inverted).

Control of the controller 113 with respect to the image acquisition conditions will be described next. FIGS. 13A and 13B are tables each showing the relationship between the image acquisition conditions and the timing of the driving signal ϕRAMP_START. FIG. 13A shows the duration of the delay time Δt_delay corresponding to the temperature of image capturing apparatus 1100 and the amplification factor of each column amplifier 1101 of the amplifier 1102 when the change rate of the electric potential of the reference signal to be used as the comparison signal is high. FIG. 13B shows the duration of the delay time Δt_delay corresponding to the temperature of image capturing apparatus 1100 and the amplification factor of each column amplifier 1101 of the amplifier 1102 when the change rate of the electric potential of the reference signal to be used as the comparison signal is low.

As shown in FIGS. 13A and 13B, the controller 113 controls the signal generator 107 so that the delay time Δt_delay becomes longer as the temperature of the image capturing apparatus 1100 detected by the temperature sensor 1001 becomes higher. The controller 113 also controls the signal generator 107 so that the delay time Δt_delay becomes longer as the amplification factor of each column amplifier 1101 of the amplifier 1102 becomes larger. Furthermore, the controller 113 controls the signal generator 107 so that the delay time Δt_delay becomes longer at a lower temperature and a smaller amplification factor when the change rate of the electric potential of the reference signal is low.

In this embodiment, in the image capturing apparatus 1100, when switching the reference signal to be used as the comparison signal in AD conversion, the comparison signal after switching needs to have an electric potential higher than that of a signal to undergo AD conversion. To achieve this, as described above, the switching destination reference signal is changed with a delay with respect to the reference signal before switching. At this time, a necessary delay time depends on a change of the electric potential of the S signal to undergo AD conversion and the time taken to switch the reference signal. The change of the electric potential of the S signal to undergo AD conversion is generated by circuit noise generated in an amplification transistor (SF) 305 of the pixel 101 or the column amplifier 1101 of the amplifier 1102. The switched comparison signal needs to start to change from an electric potential equal to or higher than the maximum amplitude of the change of the electric potential of the S signal. The time taken to switch the reference signal can be generated by a circuit delay by a determination count counter 403 or 703 and a switch 402 or 702 in addition to a circuit delay in which the output of a comparator 401 or 701 in the converter 106 is inverted. Since the electric potential of the reference signal to be used as the succeeding comparison signal changes during a period from when the magnitude relationship between the electric potential of the preceding comparison signal and that of the S signal to undergo AD conversion is inverted until the succeeding reference signal is switched, it is necessary to set the delay amount between the preceding and succeeding reference signals in consideration of the change amount.

The amplitude of the above-described circuit noise and the time taken to switch the reference signal to be used as the comparison signal can largely change depending on the image acquisition conditions. The circuit noise largely changes depending on the temperature of the image capturing apparatus 1100 and the gain of each column amplifier 1101 of the amplifier 1102. The time taken to switch the reference signal changes in accordance with the temperature of the image capturing apparatus 1100 and the change rate of the electric potential of the reference signal. Thus, in the image capturing apparatus 1100 according to each of the above-described first and second embodiments, it is necessary to set a delay time of a maximum amount for the switching destination reference signal in settings in which the temperature of the image capturing apparatus is high and the change rate of the electric potential of the reference signal is lowest. If it is considered that the amplifier 1102 is arranged, it is necessary to set a delay time of the maximum amount for the switching destination reference signal in a setting state in which the amplification factor of each column amplifier 1101 of the amplifier 1102 is largest. If a uniform delay time is set, it is necessary to set a delay time of the maximum amount in such conditions (to be referred to as corner conditions hereinafter). However, if image capturing is performed under conditions except for the corner conditions, an excessive delay is set. Setting an excessive delay time decreases the signal level at which AD conversion is performed the maximum number of times. The effect of suppressing the influence of circuit noise by performing AD conversion for the S signal a plurality of times may be reduced.

In this embodiment, the timing at which the reference signal starts to change is changed depending on the image acquisition conditions, thereby making it possible to perform AD conversion the maximum number of times within the range of the many signal levels of the S signal. That is, under the image acquisition conditions except for the corner conditions, it is possible to increase the signal level at which AD conversion can be performed the maximum number of times.

The acquired S signal values undergo correction processing and averaging processing by the output circuit 110, similarly to the above-described first embodiment. The output circuit 110 outputs the averaged signal value as the output of the pixel to the outside of the image capturing apparatus 1100.

Figure 14:
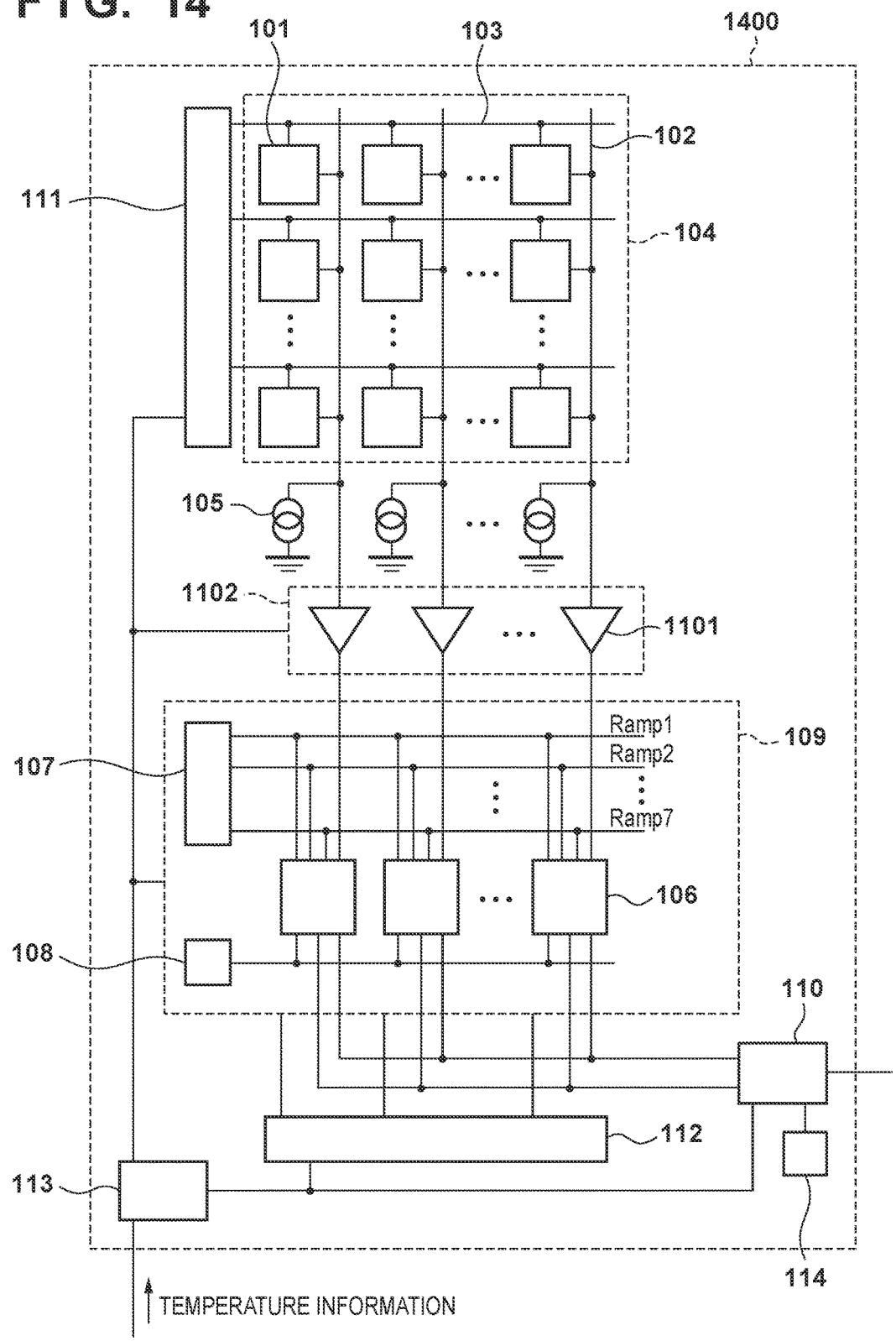
FIG. 14 is a circuit diagram showing another modification of the circuit arrangement of the image capturing apparatus shown in FIG. 1.

The arrangement of an image capturing apparatus and a driving method therefor according to still another embodiment of the present invention will be described with reference to FIGS. 14 to 17. FIG. 14 shows an example of the circuit arrangement of an image capturing apparatus 1400 according to a fourth embodiment of the present invention. The difference from the above-described first to third embodiments will mainly be described below.

Figure 11:
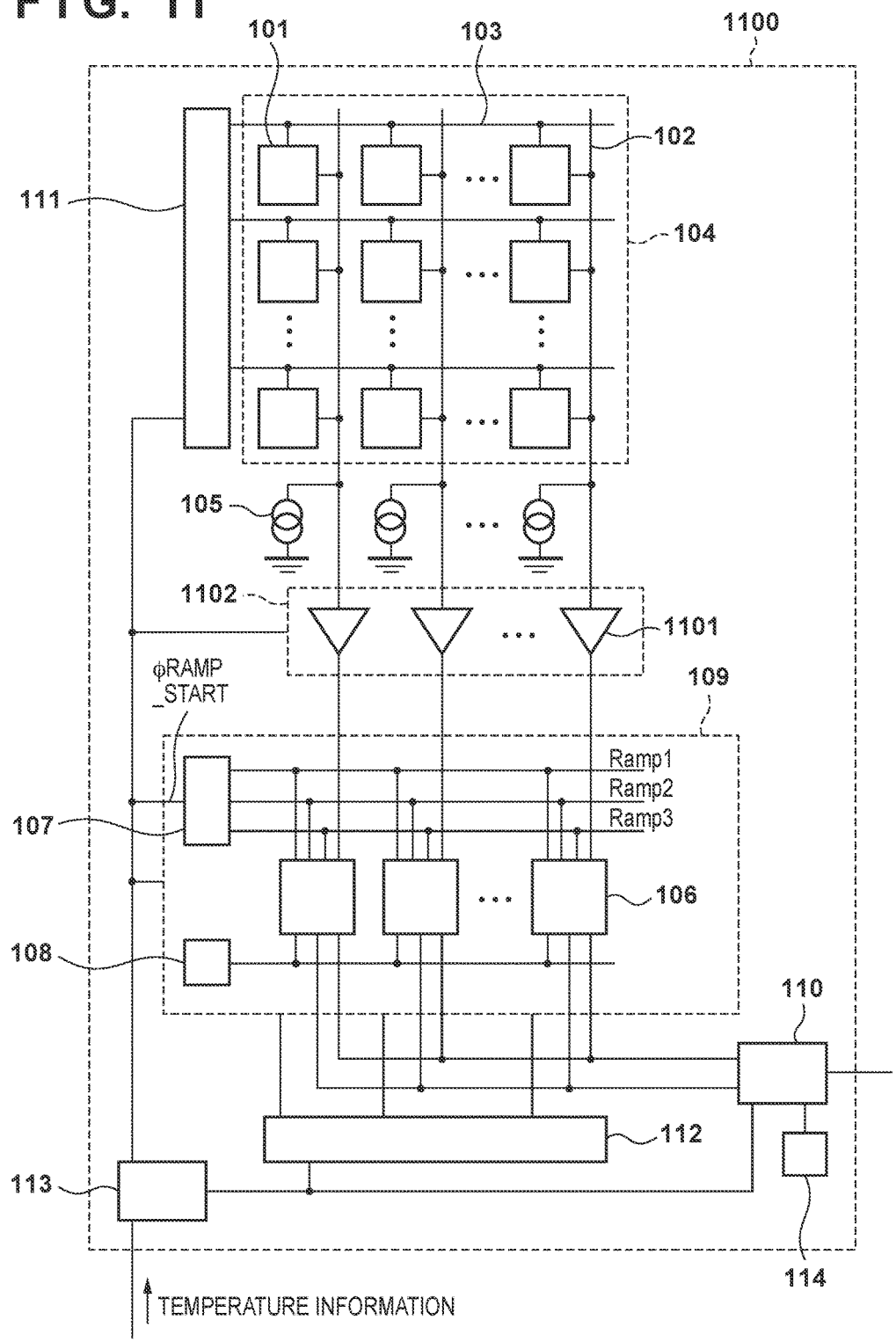
FIG. 11 is a circuit diagram showing a modification of the circuit arrangement of the image capturing apparatus shown in FIG. 1.

As compared with the image capturing apparatus 1100 shown in FIG. 11, in the image capturing apparatus 1400 according to this embodiment, a signal generator 107 generates seven kinds of reference signals Ramp1 to Ramp7 as reference signals. Similarly to each of the above-described embodiments, the signal generator 107 generates Ramp2 to Ramp7 so that each reference signal starts to change with a delay of a preset time after the start of a change of Ramp1.

On the other hand, in the above-described first to third embodiments, the reference signals whose electric potentials sequentially start to change are each used as a comparison signal in a change start order. More specifically, in the group of reference signals each of which starts to change with a delay of a preset time after the start of the change of Ramp1 next to Ramp1 that starts to change in accordance with the start of conversion of a pixel signal, Ramp2 whose electric potential starts to change next to Ramp1 is used as the comparison signal. In the group of reference signals, Ramp3 whose electric potential starts to change next to Ramp2 is used as the comparison signal. In this embodiment, however, every time the magnitude relationship between the pixel signal and the comparison signal is inverted, a controller 113 causes a converter 106 to use, as the comparison signal, each of reference signals of the group of reference signals that starts to change with a delay of a predetermined time interval according to image acquisition conditions. More specifically, the reference signals whose electric potentials sequentially start to change are each used as the comparison signal in that order, similarly to each of the above-described embodiments. Alternatively, the reference signals may be skipped and used in an order of, for example, Ramp1, Rmap4, and Ramp7. Therefore, the controller 113 outputs, to the converter 106, a mode signal corresponding to the image acquisition conditions.

Figure 15A:
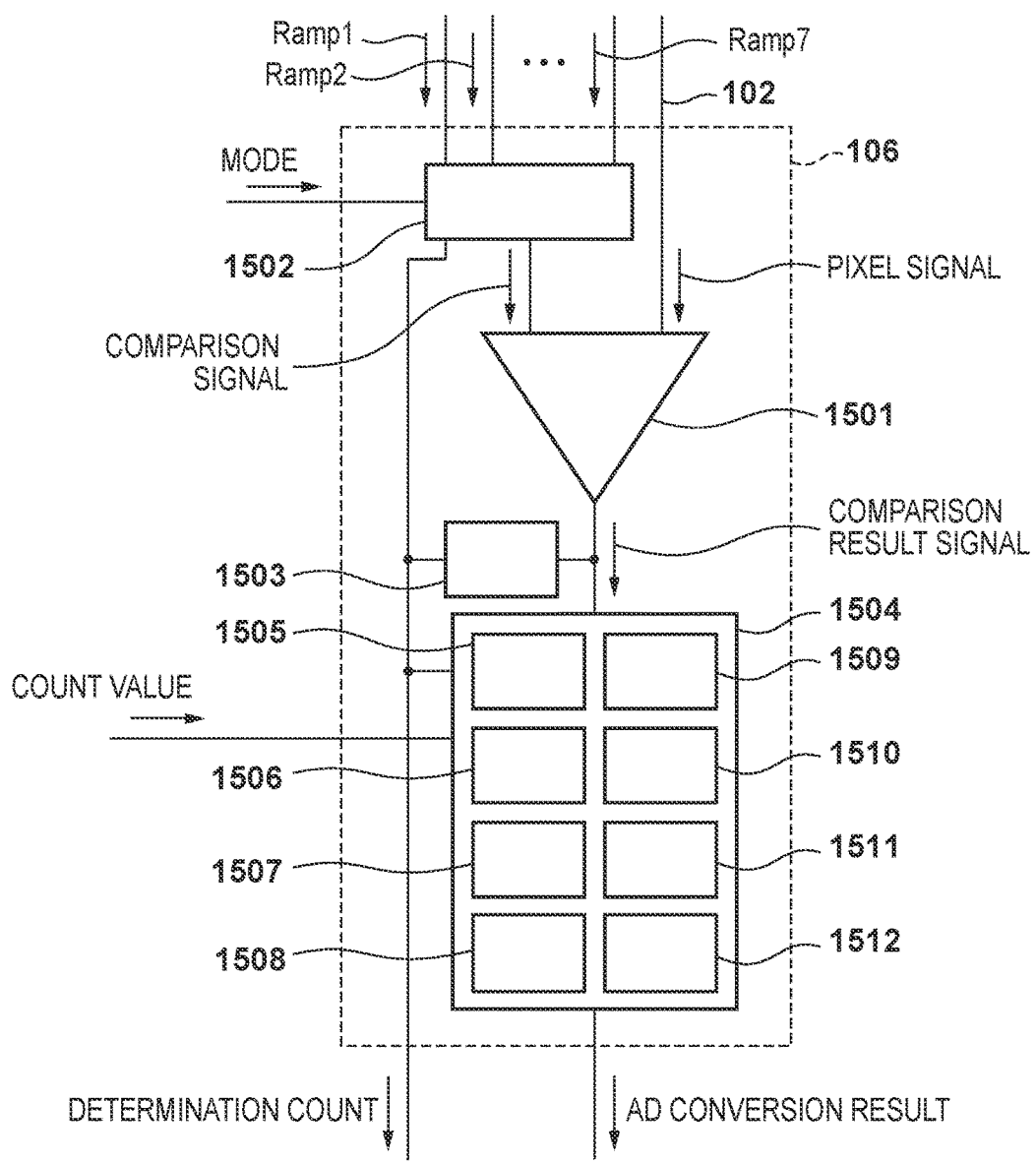
FIGS. 15A and 15B are a circuit diagram and a table, respectively, showing an example of the circuit arrangement of a converter of the image capturing apparatus shown in FIG. 14 and the relationship between a determination count and a comparison signal.
Figure 15B:
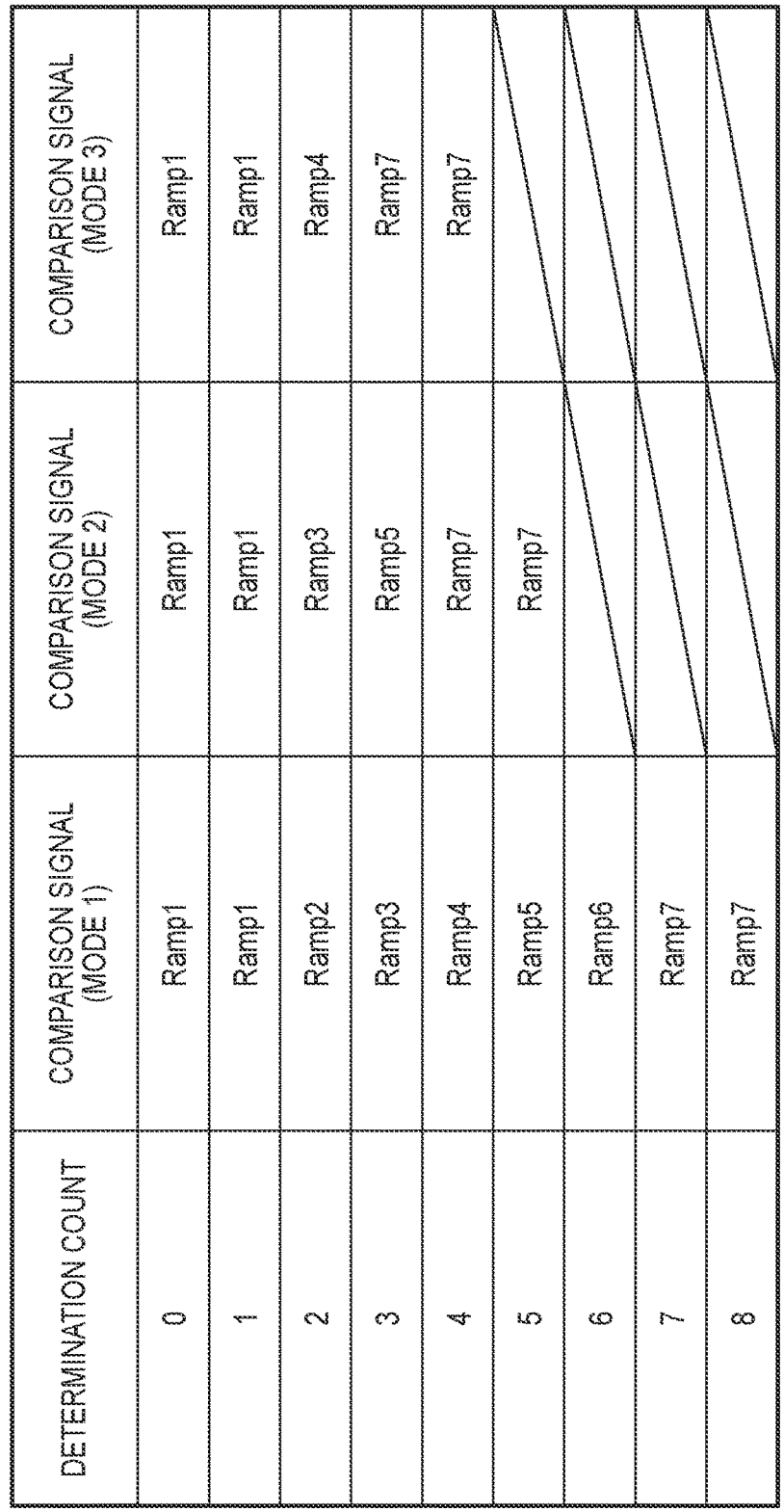

The converter 106 according to this embodiment will be described next with reference to FIGS. 15A and 15B. FIG. 15A shows an example of the circuit arrangement of the converter 106 of the image capturing apparatus 1400. FIG. 15B shows, for each mode, the relationship between a determination count and the reference signal selected as the comparison signal. As compared with the converter 106 according to each of the first to third embodiments, in the converter 106 according to this embodiment, the reference signal input to a switch 1502 is increased from Ramp1 to Ramp7. An S signal latch D 1509, an S signal latch E 1510, an S signal latch F 1511, and an S signal latch G 1512 are added. A mode signal is input from the controller 113 to the switch 1502. As shown in FIG. 15B, in accordance with the determination count, the switch 1502 switches the reference signal selected as the comparison signal. The reference signal used for AD conversion of the N signal is the same as that used for first AD conversion of the S signal, which is Ramp1. However, as the comparison signal used for second or subsequent AD conversion, a different reference signal is selected depending on the mode signal which is output by the controller 113 in accordance with the image acquisition conditions. Furthermore, the number of times AD conversion is performed changes depending on the mode. In mode 1, each of Ramp1 to Ramp7 is used as the comparison signal for the S signal to perform AD conversion seven times. In mode 2, each of Ramp1, Ramp3, Ramp5, and Ramp7 is used for the S signal to perform AD conversion four times. In mode 3, each of Ramp1, Ramp4, and Ramp7 is used for the S signal to perform AD conversion three times. Detailed control by the controller 113 for selecting each reference signal will be described with reference to FIGS. 16A to 16C. By using a different reference signal as the comparison signal in accordance with the image acquisition conditions, it is possible to set a delay time appropriate to each set of image acquisition conditions.

Figure 16A:
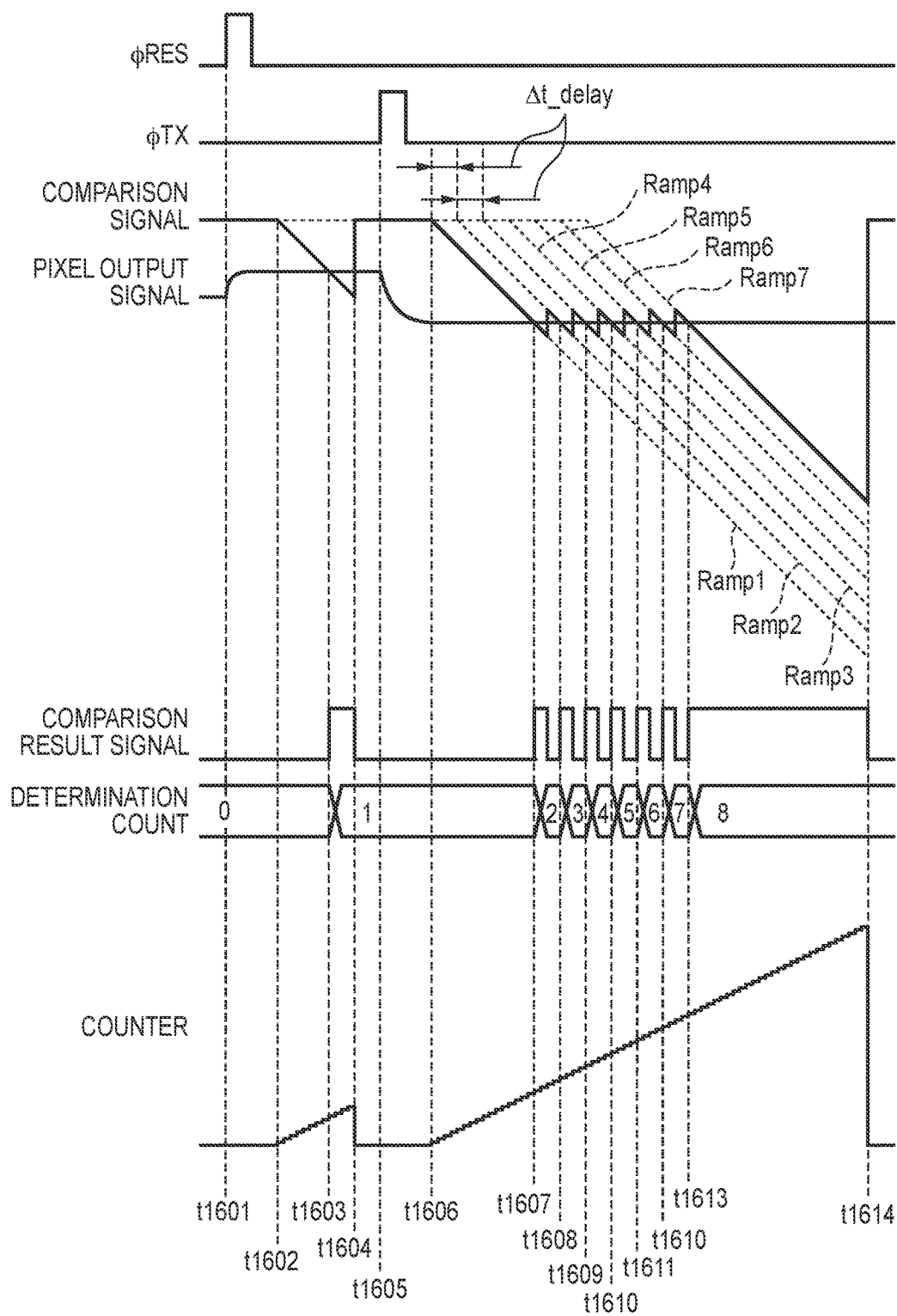
FIGS. 16A to 16C are timing charts each for explaining driving of the image capturing apparatus shown in FIG. 14.
Figure 16B:
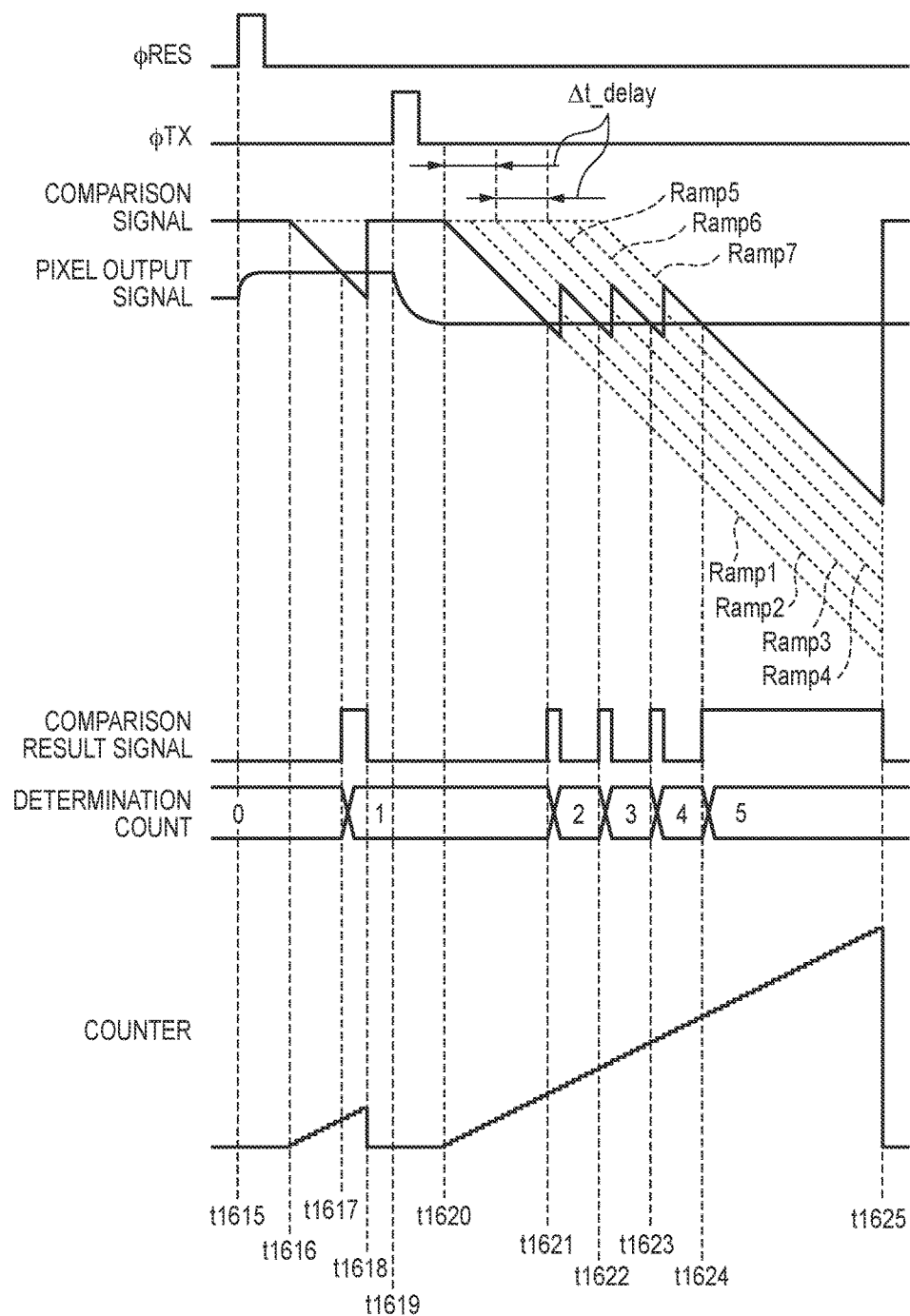
Figure 16C:
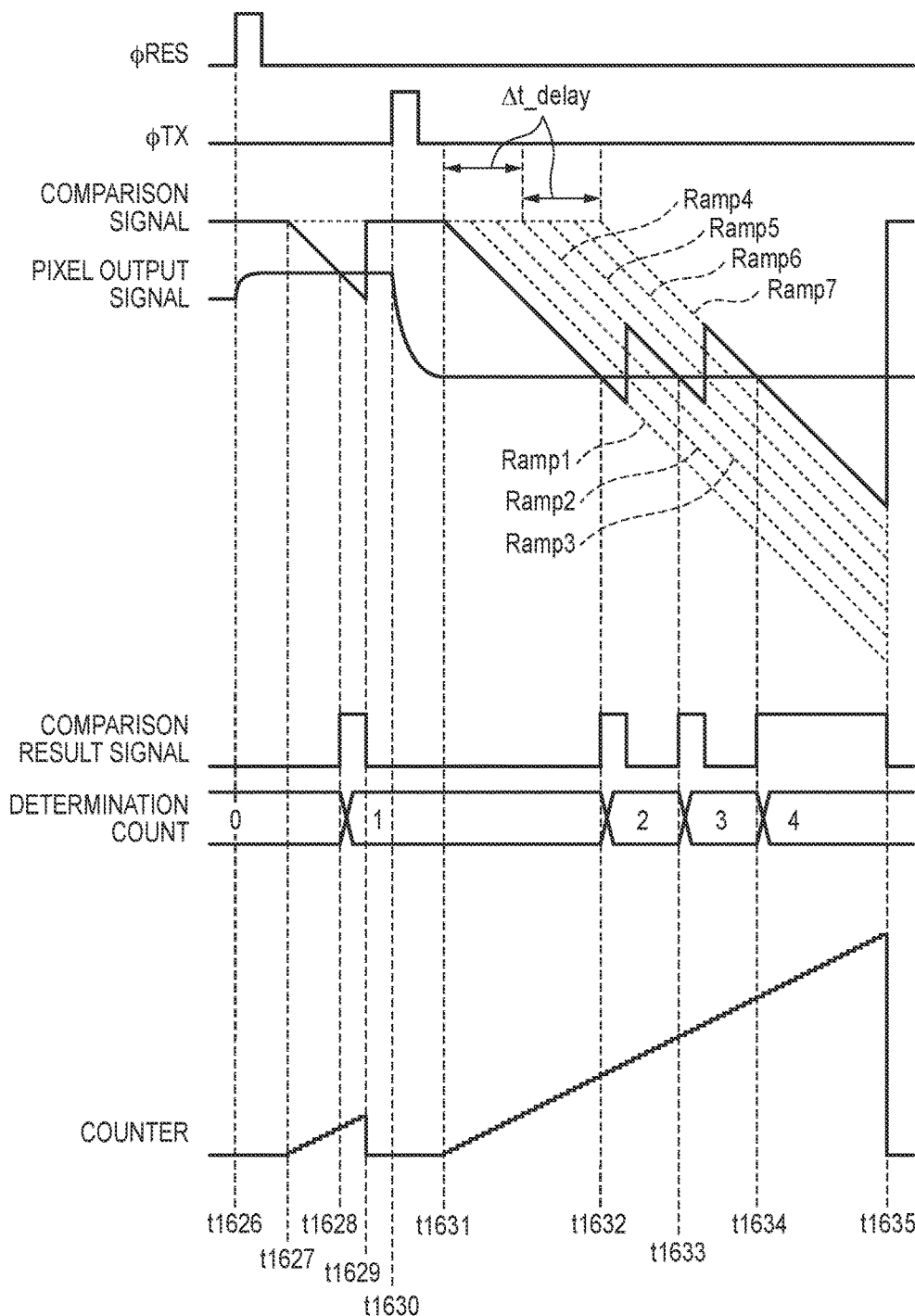

The driving method for the image capturing apparatus 1400 according to this embodiment will be described next with reference to FIGS. 16A to 16C. FIGS. 16A to 16C are timing charts each showing driving of the image capturing apparatus 1400. FIG. 16A shows an operation in mode 1, FIG. 16B shows an operation in mode 2, and FIG. 16C shows an operation in mode 3. The relationship between the image acquisition conditions and the mode will be described later.

As shown in FIGS. 16A to 16C, the signal generator 107 generates the respective reference signals so that the electric potentials of the reference signals start to change in an order from Ramp1 to Ramp7 during a period from time t1606 to time t1614, a period from time t1620 to time t1625, or a period from time t1631 to t1635 when AD conversion of the S signal is performed. As shown in FIG. 16A, in mode 1, the controller 113 causes the converter 106 to use the reference signal selected as the comparison signal in AD conversion of the S signal in the order from Ramp1 to Ramp7. As shown in FIG. 16B, in mode 2, the controller 113 causes the converter 106 to use the reference signal selected as the comparison signal in AD conversion of the S signal in the order of Ramp1, Ramp3, Ramp5, and Ramp7. As shown in FIG. 16C, in mode 3, the controller 113 causes the converter 106 to use the reference signal selected as the comparison signal in AD conversion of the S signal in the order of Ramp1, Ramp4, and Ramp7. This causes the controller 113 to change the mode in accordance with the image acquisition conditions, and set a different delay time Δt_delay between the start of a change of the reference signal before switching and the start of a change of the reference signal after switching while setting a different number of times AD conversion is performed for the S signal.

FIG. 17 is a table showing the relationship between the image acquisition conditions and a mode signal output from the controller 113. As shown in FIG. 17, if the temperature of the image capturing apparatus 1400 is high and the amplification factor of each column amplifier 1101 of an amplifier 1102 is large, mode 3 in which the delay time Δt_delay is longest is selected. If the temperature of the image capturing apparatus 1400 is low and the amplification factor of each column amplifier 1101 of the amplifier 1102 is small, mode 1 in which the delay time Δt_delay is shortest is selected.

In this embodiment, in accordance with the image acquisition conditions, a different reference signal is selected as the comparison signal. That is, in accordance with the image acquisition conditions, the delay time Δt_delay is changed, and it is possible to control, to a different electric potential, the electric potential difference between the electric potential of the preceding reference signal and that of the succeeding reference signal when switching the reference signal to be used as the comparison signal in AD conversion of the S signal. As a result, in accordance with the image acquisition conditions, the delay time of the reference signal used as the comparison signal can be controlled appropriately. This can prevent the delay time from being set longer than necessary, similarly to the above-described third embodiment, and perform AD conversion a plurality of times for a signal of a higher signal level under image acquisition conditions except for the corner conditions. Furthermore, by increasing the number of reference signals, and increasing, in accordance with the signal level of the S signal, the number of times AD conversion is performed, it is possible to improve the effect of reducing circuit noise under image acquisition conditions except for the corner conditions.

Figure 18A:
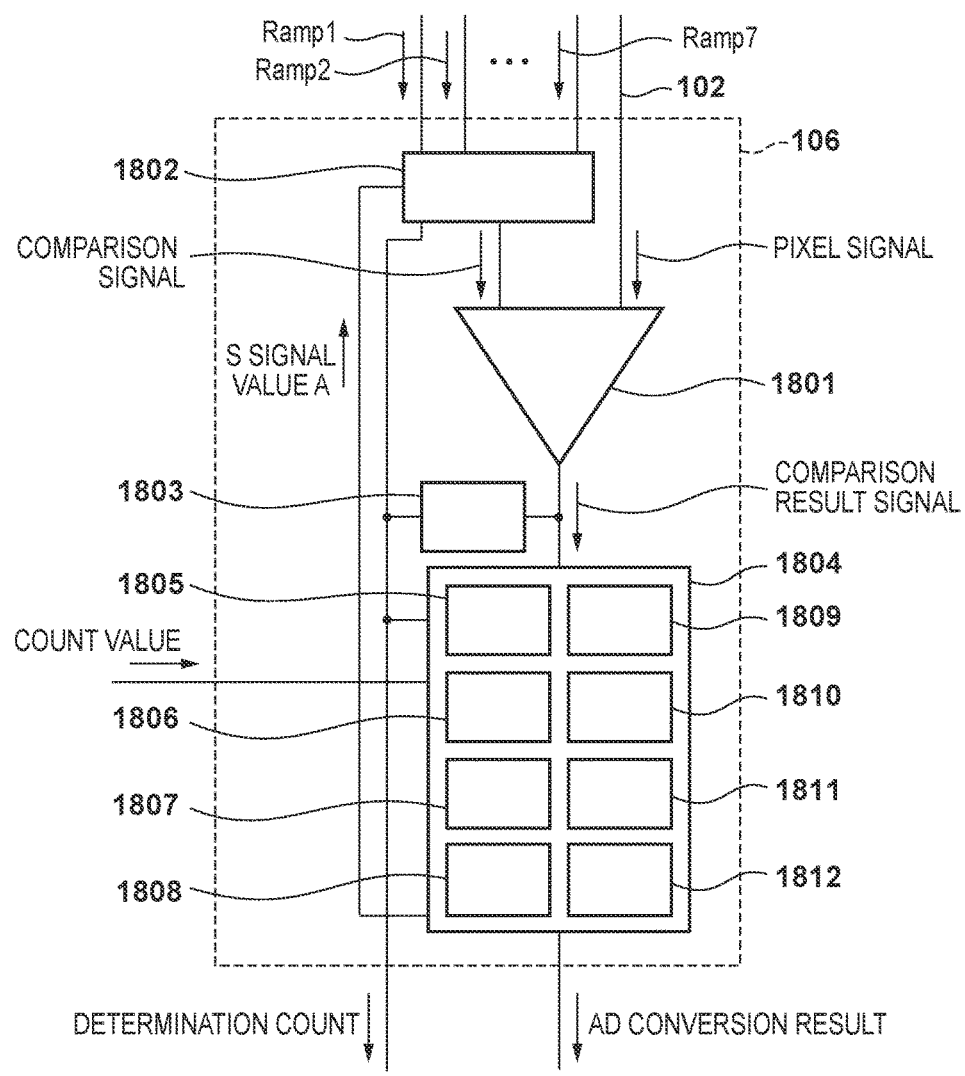

The arrangement of an image capturing apparatus and a driving method therefor according to still another embodiment of the present invention will be described with reference to FIGS. 18A to 19C. FIG. 18A is a circuit diagram showing an example of the circuit arrangement of a converter 106 of an image capturing apparatus according to a fifth embodiment of the present invention. The components of the image capturing apparatus except for the converter 106 may be the same as those of the image capturing apparatus 1400 shown in FIG. 14 according to the above-described fourth embodiment. The difference from the above-described first to fourth embodiments will mainly be described below.

FIG. 18A shows an example of the arrangement of the converter 106 according to this embodiment. FIG. 18B shows the relationship between a determination count and a reference signal selected as a comparison single in accordance with the signal level of an S signal.

The converter 106 according to this embodiment is different from that according to the fourth embodiment in that S signal value A as a result of first AD conversion of an S signal is input from a counter 1804 to a switch 1802. In accordance with the signal level of S signal value A, the switch 1802 selects a reference signal to be used as a comparison signal in second or subsequent AD conversion. That is, in this embodiment, every time the magnitude relationship between a pixel signal and the comparison signal is inverted, each reference signal that starts to change with a delay of a predetermined time interval according to the signal level of the S signal is selected as a comparison signal from a group of reference signals.

As shown in FIG. 18B, the switch 1802 compares the signal level of S signal value A with the first and second thresholds. In accordance with the magnitude relationship, the switch 1802 switches the reference signal selected as the comparison signal in the case of a determination count of 2 or more. The first threshold is smaller in signal level than the second threshold. The number of times AD conversion is performed changes depending on the signal level of S signal value A. For a determination count of 0 at which the N signal is AD-converted and a determination count of 1 at which the S signal is AD-converted for the first time, S signal value A is not confirmed, and thus Ramp1 is selected for the determination count of 0 or 1 regardless of S signal value A. For the determination count of 2 or more, the different reference signal is selected as the comparison signal in accordance with the signal level of S signal value A. When outputting the determination count of 2 to the switch 1802, a determination count counter 1803 may set a delay so that the determination count is switched after the switch 1802 ends magnitude determination of S signal value A.

Figure 19A:
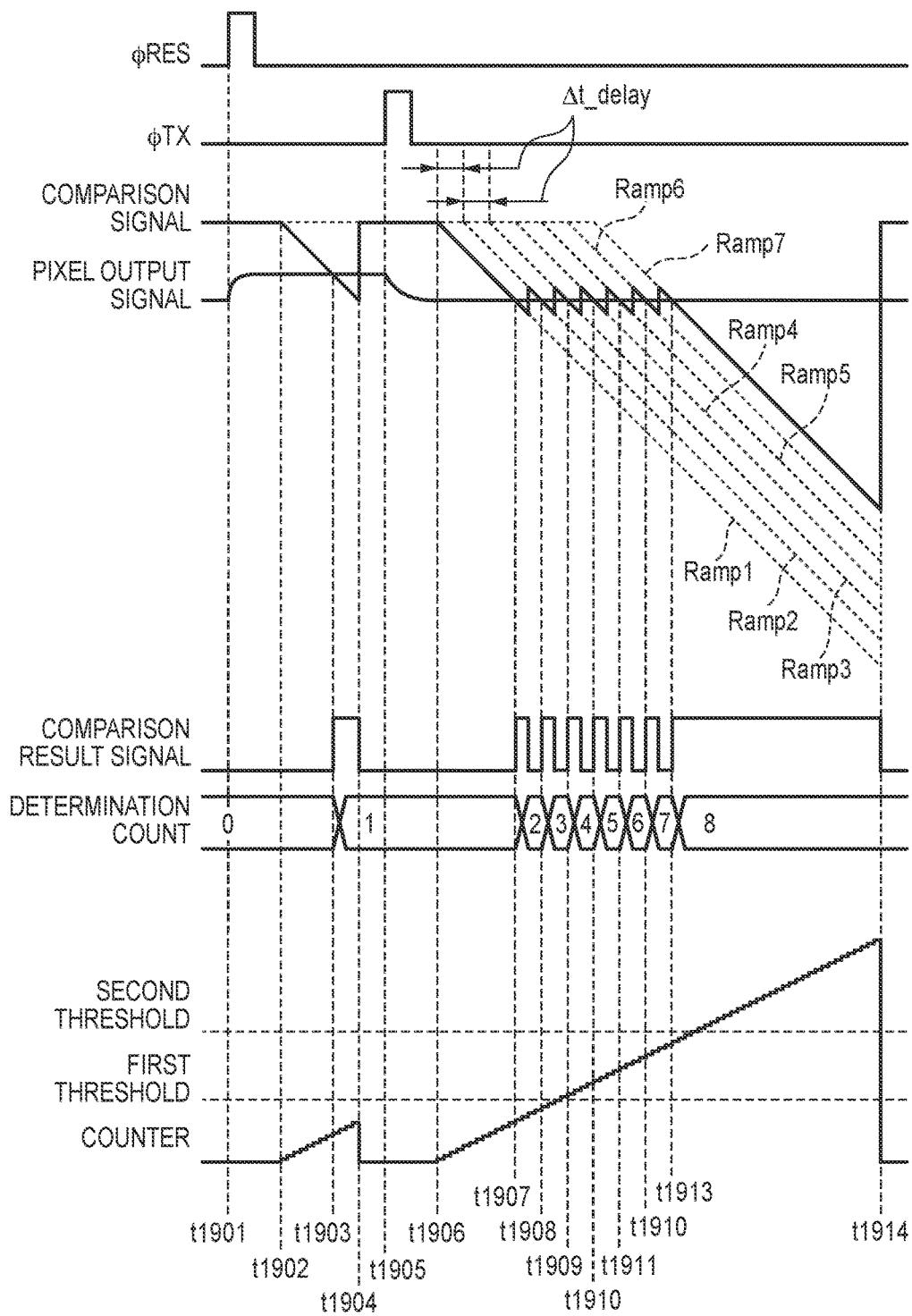
FIGS. 19A to 19C are timing charts each for explaining driving of the image capturing apparatus shown in FIG. 14.
Figure 19B:
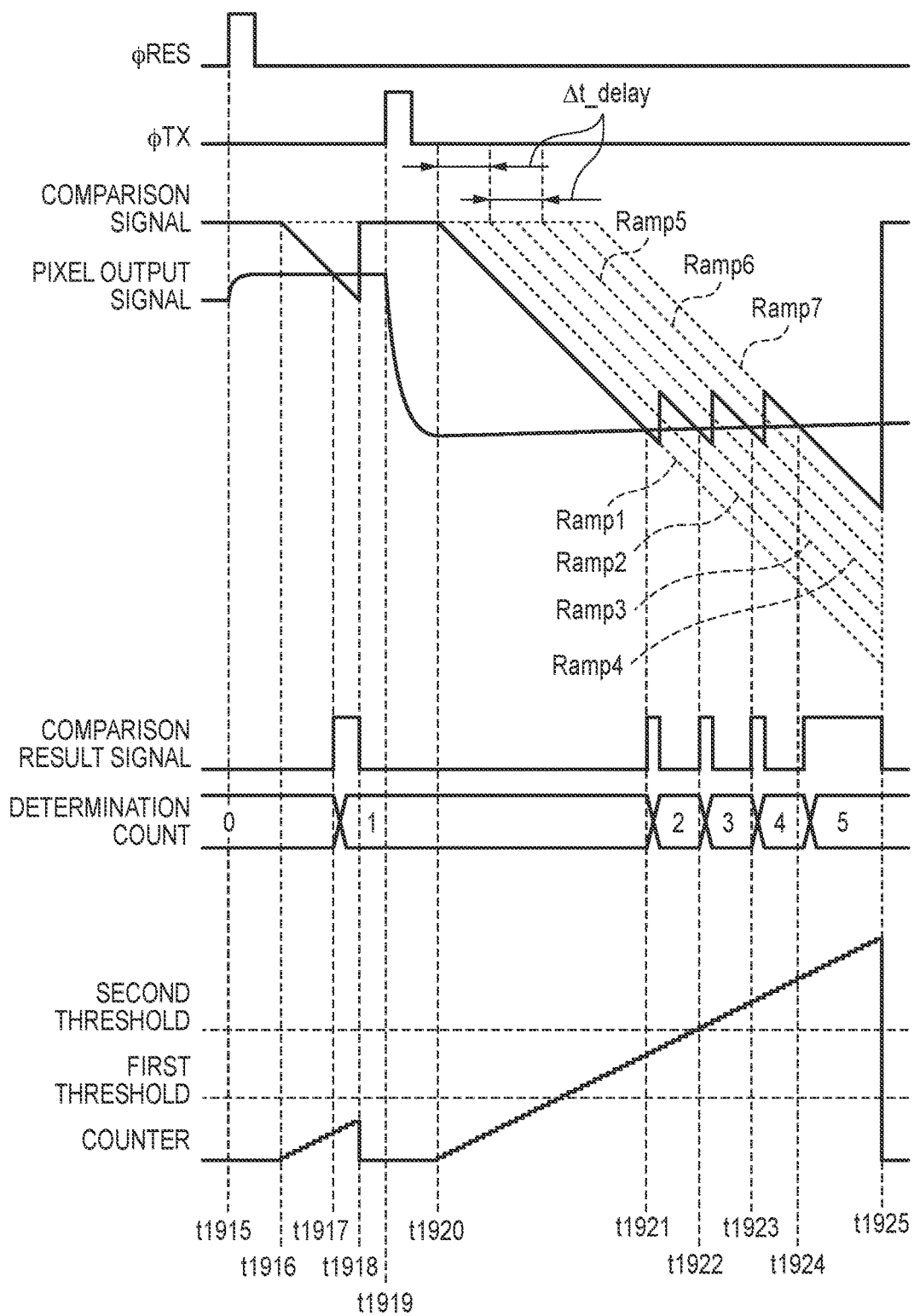
Figure 19C:
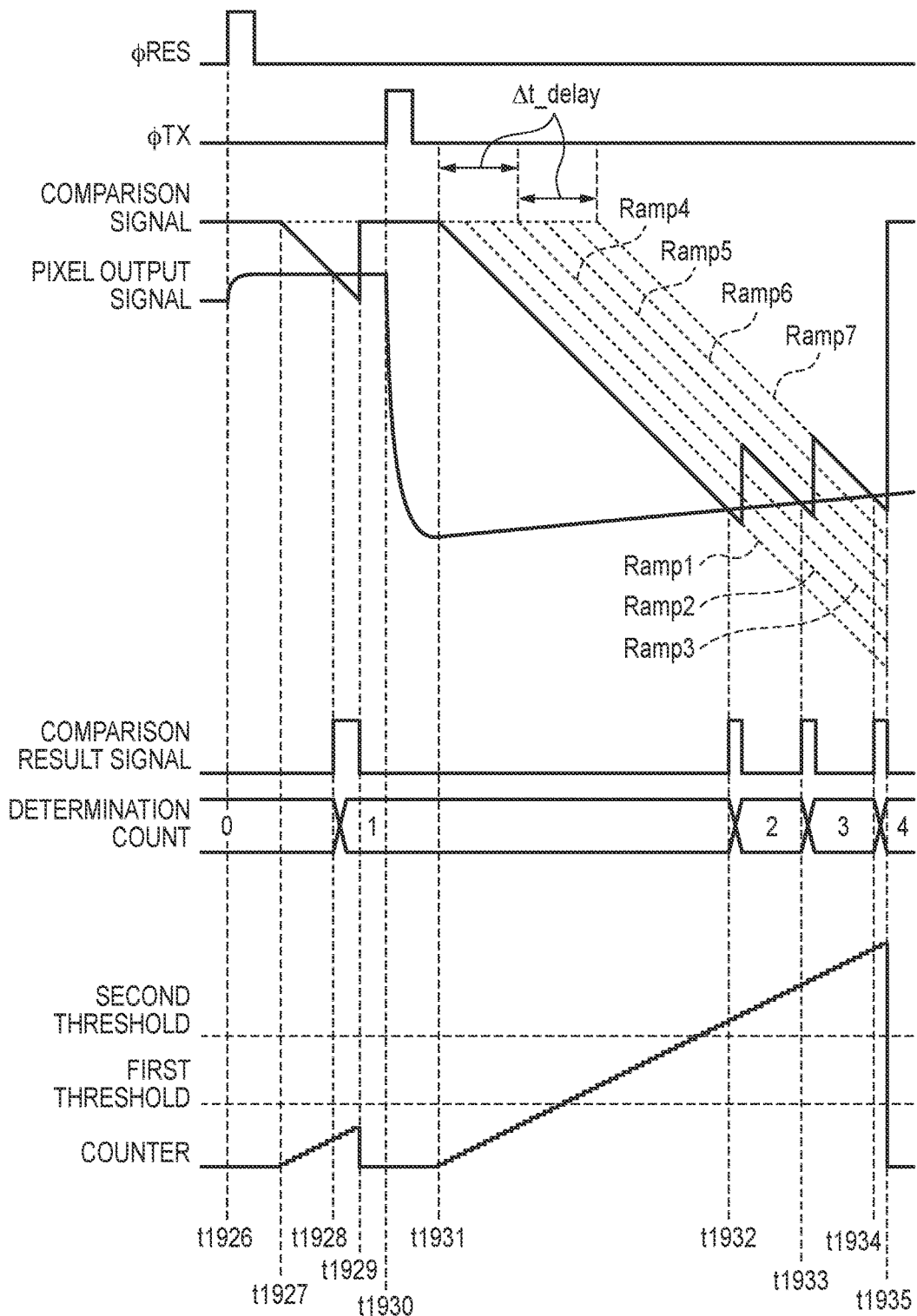

The driving method for the image capturing apparatus according to this embodiment will be described next with reference to FIGS. 19A to 19C. FIGS. 19A to 19C are timing charts each showing driving of the image capturing apparatus according to this embodiment. FIG. 19A shows an operation when the signal level of S signal value A is lower than the first threshold. FIG. 19B shows an operation when the signal level of S signal value A falls within the range of the first threshold (inclusive) to the second threshold (exclusive). FIG. 19C shows an operation when the signal level of S signal value A is equal to or higher than the second threshold.

As shown in FIGS. 19A to 19C, control is performed so that a delay time Δt_delay between the start of a change of the reference signal before switching and the start of a change of the reference signal after switching becomes longer as the signal level of S signal value A is higher. That is, control is performed so that the delay time becomes longer as the signal level output from each column amplifier 1101 of an amplifier 1102 after transferring charges is higher. In this embodiment, unlike the above-described first to fourth embodiments, the reference signal used by the converter 106 for second or subsequent AD conversion of the S signal may be different while the number of times AD conversion is performed may be different.

As for a signal of a high signal level, an electric potential difference applied to a reset transistor is large, and thus a leak current increases. As shown in FIG. 19C, a temporal change in electric potential is large, and thus it may be necessary to prolong the delay time of the reference signal. Therefore, the first and second thresholds need to satisfy a delay amount such that a comparison signal is reliably switched to an electric potential higher than that of the S signal, when switching the reference signal, from the change amount of the leak current with respect to the signal level. To cope with this, the delay time Δt_delay of the reference signal selected as the comparison signal is changed in accordance with the signal level, thereby controlling, to a different electric potential, the electric potential difference between the electric potential of the preceding reference signal and that of the succeeding reference signal when switching the reference signal to be used as the comparison signal in AD conversion of the S signal. With this processing, when switching the reference signal, the reference signal selected as the comparison signal is switched to have an electric potential higher than that of the S signal.

In this embodiment, control is performed so that the delay time Δt_delay between the start of a change of the reference signal precedingly selected as the comparison signal and the start of a change of the reference signal succeedingly selected is changed in accordance with the signal level of the S signal. This can end a plurality of AD conversion operations earlier for the S signal of a low signal level, thereby reducing the influence of a temporal change of the signal to undergo AD conversion. As for a signal of a low signal level, a small change in signal level is easy to observe on an image. Thus, it is possible to effectively prevent the image quality from degrading due to a temporal change.

Although the embodiments of the present invention have been explained above, the present invention is not limited to them, as a matter of course. The above-described embodiments can be changed or combined appropriately without departing from the spirit and scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2016-196730, filed Oct. 4, 2016 and No. 2017-125588, filed Jun. 27, 2017, which are hereby incorporated by reference wherein in their entirety.

What is claimed is:

1. An image capturing apparatus comprising:
a pixel array in which a plurality of pixels are arranged;
a signal generator, comprising circuitry, that generates a plurality of reference signals whose electric potential changes with time;
a comparator that compares a pixel signal output from the pixel array with only one of the plurality of reference signals at a time;
a counter that holds, as a signal value, a count value obtained by counting from (i) a start of the comparison by the comparator between the pixel signal and the only one reference signal until (ii) an inversion of a magnitude relationship between the pixel signal and the only one reference signal; and
a controller, comprising circuitry, that controls the signal generator, the comparator, and the counter,
wherein the plurality of reference signals include (i) a first reference signal and (ii) a second reference signal that starts to change with a delay of a preset time after the start of the change of the first reference signal,
wherein the controller causes the comparator to compare the pixel signal with the first reference signal and causes the counter to hold a count value when a magnitude relationship between the pixel signal and the first reference signal is inverted, and
wherein the controller further causes the comparator to compare the pixel signal with the second reference signal and further causes the counter to hold a count value when a magnitude relationship between the pixel signal and the second reference signal is inverted.

2. The apparatus according to claim 1, wherein a number of signal values held by the counter changes depending on a magnitude of a signal level of the pixel signal.

3. The apparatus according to claim 1, wherein the plurality of reference signals further includes a third reference signal that starts to change with a delay of a preset time after the start of the change of the second reference signal, and
wherein the controller further causes the comparator to start comparing the pixel signal with the third reference signal when the magnitude relationship between the pixel signal and the second reference signal is inverted, and further causes the counter to hold a count value when the magnitude relationship between the pixel signal and the third reference signal is inverted.

4. The apparatus according to claim 3, wherein a time from the start of the change of the electric potential of the first reference signal until the start of the change of the electric potential of the second reference signal is equal to a time from the start of the change of the electric potential of the second reference signal until the start of the change of the electric potential of the third reference signal.

5. The apparatus according to claim 3, wherein the second reference signal is a reference signal that starts to change next to the first reference signal, among the plurality of reference signals, and
wherein the third reference signal is a reference signal that starts to change next to the second reference signal, among the plurality of reference signals.

6. The apparatus according to claim 1, wherein the signal generator generates the second reference signal so as to start to change with a delay of a time preset in accordance with an image acquisition condition after the start of the change of the first reference signal.

7. The apparatus according to claim 3, wherein the signal generator generates the second reference signal so as to start to change with a delay of a time preset in accordance with an image acquisition condition after the start of the change of the first reference signal, and generates the third reference signal so as to start to change with a delay of a time preset in accordance with the image acquisition condition after the start of the change of the second reference signal.

8. The apparatus according to claim 6, further comprising a temperature sensor that detects a temperature of the image capturing apparatus, wherein the image acquisition condition includes the temperature of the image capturing apparatus.

9. The apparatus according to claim 8, wherein the delay of a preset time is directly proportional to the temperature detected by the temperature sensor.

10. The apparatus according to claim 6, wherein the controller causes the signal generator to change a change rate of electric potentials of the plurality of reference signals in accordance with a user setting, and wherein the image acquisition condition includes the change rate.

11. The apparatus according to claim 10, wherein the delay of a preset time is inversely proportional to the change rate.

12. The apparatus according to claim 6, further comprising an amplifier that amplifies the pixel signal, wherein the comparator compares the pixel signal amplified by the amplifier with the first and second reference signals, and wherein the image acquisition condition includes an amplification factor of the pixel signal in the amplifier.

13. The apparatus according to claim 12, wherein the delay of a preset time is directly proportional to the amplification factor.

14. The apparatus according to claim 1, further comprising an output circuit that outputs signals corresponding to the signal values held in the counter.

15. The apparatus according to claim 14, wherein the controller causes the comparator to compare the pixel signal output from the pixel array with each of the plurality of the reference signals, and wherein the controller causes the counter to hold count values when the magnitude relationship between the pixel signal and each of the plurality of reference signals is inverted and to output to the output circuit, as reference values, count values.

16. The apparatus according to claim 15, wherein the output circuit corrects each of the signal values using the reference value obtained by the same reference signal among the plurality of reference signals.

17. The apparatus according to claim 14, wherein with respect to each of the signal values, the output circuit performs offset correction.

18. The apparatus according to claim 14, wherein with respect to each of the signal values, the output circuit performs gain correction.

19. The apparatus according to claim 14, wherein the output circuit averages the signal values obtained from the pixel signal for each of the plurality of pixels, and outputs the averaged signal value as a signal from the pixel.

20. An image capturing system comprising:
(1) an image capturing apparatus; and
(2) a signal processor that generates an image by processing a signal output from the image capturing apparatus,
wherein the image capturing apparatus comprises:
(a) a pixel array in which a plurality of pixels are arranged;
(b) a signal generator, comprising circuitry, that generates a plurality of reference signals whose electric potential changes with time;
(c) a comparator that compares a pixel signal output from the pixel array with only one of the plurality of reference signals at a time;
(d) a counter that holds, as a signal value, a count value obtained by counting from (i) a start of the comparison by the comparator between the pixel signal and the only one reference signal until (ii) an inversion of a magnitude relationship between the pixel signal and the only one reference signal; and
(e) a controller, comprising circuitry, that controls the signal generator, the comparator, and the counter,
wherein the plurality of reference signals include (i) a first reference signal and (ii) a second reference signal that starts to change with a delay of a preset time after the start of the change of the first reference signal,
wherein the controller causes the comparator to compare the pixel signal with the first reference signal and causes the counter to hold a count value when a magnitude relationship between the pixel signal and the first reference signal is inverted, and
wherein the controller further causes the comparator to compare the pixel signal with the second reference signal and further causes the counter to hold a count value when a magnitude relationship between the pixel signal and the second reference signal is inverted.

21. An apparatus comprising:
a pixel array in which a plurality of pixels are arranged, wherein the apparatus generates a plurality of reference signals whose electric potential changes with time;
a comparator that compares a pixel signal output from the pixel array with only one of the plurality of reference signals at a time; and
a counter that holds, as a signal value, a count value obtained by counting from (i) a start of the comparison by the comparator between the pixel signal and the only one reference signal until (ii) an inversion of a magnitude relationship between the pixel signal and the only one reference signal,
wherein the plurality of reference signals include (i) a first reference signal and (ii) a second reference signal that starts to change with a delay of a preset time after the start of the change of the first reference signal,
wherein the apparatus causes the comparator to compare the pixel signal with the first reference signal, and causes the counter to hold a count value when a magnitude relationship between the pixel signal and the first reference signal is inverted, and
wherein the apparatus further causes the comparator to compare the pixel signal with the second reference signal, and further causes the counter to hold a count value when a magnitude relationship between the pixel signal and the second reference signal is inverted.

22. An apparatus comprising:
a pixel array in which a plurality of pixels are arranged;
a comparator that compares a pixel signal output from the pixel array with only one of a plurality of reference signals whose electric potential changes with time, at a time; and
a counter that holds, as a signal value, a count value obtained by counting from (i) a start of the comparison by the comparator between the pixel signal and the only one reference signal until (ii) an inversion of a magnitude relationship between the pixel signal and the only one reference signal,
wherein the plurality of reference signals include (i) a first reference signal and (ii) a second reference signal that starts to change with a delay of a preset time after the start of the change of the first reference signal,
wherein the apparatus causes the comparator to compare the pixel signal with the first reference signal, and causes the counter to hold a count value when a magnitude relationship between the pixel signal and the first reference signal is inverted, and wherein the apparatus further causes the comparator to compare the pixel signal with the second reference signal, and further causes the counter to hold a count value when a magnitude relationship between the pixel signal and the second reference signal is inverted.

* * * * *